United States Patent [19]

Sugaya et al.

[11] Patent Number: 5,783,833
[45] Date of Patent: Jul. 21, 1998

[54] METHOD AND APPARATUS FOR ALIGNMENT WITH A SUBSTRATE, USING COMA IMPARTING OPTICS

[75] Inventors: Ayako Sugaya, Kawasaki; Masahiro Nakagawa, Yokohama, both of Japan

[73] Assignee: Nikon Corporation, Japan

[21] Appl. No.: 570,924

[22] Filed: Dec. 12, 1995

[30] Foreign Application Priority Data

| Dec. 12, 1994 | [JP] | Japan | 6-307614 |
| Feb. 8, 1995 | [JP] | Japan | 7-020325 |
| Apr. 14, 1995 | [JP] | Japan | 7-089404 |

[51] Int. Cl.⁶ .................................................. G01N 21/86
[52] U.S. Cl. .................................. 250/548; 356/401
[58] Field of Search ......................... 250/548; 356/399, 356/400, 401

[56] References Cited

U.S. PATENT DOCUMENTS

| 5,477,057 | 12/1995 | Angeley et al. | 250/548 |
| 5,483,079 | 1/1996 | Yonezawa | 250/559.29 |
| 5,483,349 | 1/1996 | Suzuki | 356/401 |

FOREIGN PATENT DOCUMENTS

| 63-90825 | 4/1988 | Japan . |
| 2-99907 | 4/1990 | Japan . |
| 3-42611 | 2/1991 | Japan . |
| 4-65603 | 3/1992 | Japan . |
| 4-273246 | 9/1992 | Japan . |
| 190424 | 7/1993 | Japan . |

*Primary Examiner*—Edward P. Westin
*Assistant Examiner*—Alan L. Giles
*Attorney, Agent, or Firm*—Pennie & Edmonds LLP

[57] ABSTRACT

A wafer is brought into focus with a projection optical system, and a wafer mark on the wafer is also brought into focus with an off-axis alignment sensor highly accurately according to an automatic focusing process. First, a deviation of the surface of the wafer from an image plane of the projection optical system is measured by an oblique-incidence main AF sensor. For measuring the position of the wafer mark with an imaging device of an alignment system, part of a focusing ray of light from the wafer passes through an optical system, which is not telecentric, composed of an AF relay system and a half beam shield plate, and is detected by the imaging device, whereupon an image of a focusing mark projected onto the wafer is formed on the imaging device. The position of the image of the focusing mark on the imaging device is calibrated on the basis of the deviation which has been measured by the oblique-incidence main AF sensor.

19 Claims, 19 Drawing Sheets

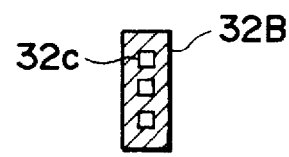

METHOD AND APPARATUS FOR ALIGNMENT WITH A SUBSTRATE, USING COMA IMPARTING OPTICS

BACKGROUND OF THE INVENTION

1. Field of the Invention

The present invention relates to a method of and an apparatus for aligning a mask pattern and a photosensitive substrate with each other in a projection exposure apparatus, and more particularly to a method of and an apparatus for aligning a mask pattern and a substrate such as a semiconductor wafer, a liquid-crystal display plate, or the like with each other by detecting alignment marks on the substrate with an off-axis alignment sensor.

2. Related Background Art

For fabricating semiconductor devices, liquid-crystal display devices, etc. through photolithography, there has heretofore been used a projection exposure apparatus known as a stepper or the like which transfers an image produced by a projection optical system having a pattern on a reticle as a mask onto each shot area on a wafer, a glass plate, or the like which has been coated with a photosensitive material such as a photoresist. The projection optical system employed in the projection exposure apparatus has a large numerical aperture and a small depth of focus. Therefore, the projection exposure apparatus includes an automatic focusing mechanism which, after a wafer that has been set in an exposure position, detects the focused position of the wafer along the optical axis of the projection optical system at a given measurement spot on the wafer, and brings the detected focused position into alignment with the image plane of the projection optical system.

Recent trends of projection optical systems are toward greater numerical apertures and smaller depths of focus. This tendency poses problems such as a reduction in the resolution in an exposure field of the projection optical system due to surface irregularities or gradients of wafers, and a reduction in the uniformity of the line width of projected images. To circumvent those difficulties, there has been proposed an automatic leveling mechanism for detecting an angle by which the average surface of the wafer is inclined to the image plane and effecting a control process to eliminate the angle in each exposure position. One known leveling sensor for detecting such an angle is an oblique-incidence collimator leveling detection system. Japanese laid-open patent publication No. 58-113706 discloses a combination of such an oblique-incidence collimator leveling detection system and an oblique-incidence focus detection system.

Efforts have been made in recent years to use exposure light of shorter wavelengths for increased resolution for the fabrication of highly integrated circuits. For example, it has been attempted to use a KrF excimer laser beam having a wavelength $\lambda$ of 248.5 nm or an ArF excimer laser beam having a wavelength $\lambda$ of 193 nm as exposure light. However, projection exposure apparatus which employ excimer laser beams poses certain problems. For example, a projection exposure apparatus with a KrF excimer laser beam used as exposure light may achieve alignment between a reticle and a wafer with alignment light having a different wavelength from that of the exposure light based on a TTL (through-the-lens) photometric system. Since a light source of alignment light having a wavelength close to that of the exposure light is not available, however, the projection exposure apparatus has to use alignment light whose wavelength largely differs from that of the exposure light. Consequently, realizing an alignment optical system with well corrected chromatic aberration in the projection exposure apparatus needs to place a chromatic aberration corrector at the position of a pupil in the projection exposure system. Such a chromatic aberration corrector imposes limitations on the performance of the projection exposure system.

If an excimer laser beam itself is used as alignment light to align a reticle and a wafer, then many problems have to be solved because the photoresist on the wafer is exposed to the excimer laser beam and the excimer laser beam is emitted from a pulse excimer laser beam source that suffers large output variations from pulse to pulse. For the above reasons, it is effective for a projection exposure system having a far-ultraviolet exposure light source to use an off-axis alignment sensor which is positioned a certain distance off the projection optical system and dedicated for detecting the position of an alignment mark (wafer mark) on a wafer. Unlike the TTL photometric system, the off-axis alignment sensor is free of limitations regarding exposure light wavelengths and detection processes. In addition, if the stage accuracy and temperature and air-conditioning control accuracy for the off-axis alignment sensor are improved, then the off-axis alignment sensor can achieve alignment of sufficiently high reproducibility comparable to the TTL photometric system.

SUMMARY OF THE INVENTION

According to the present invention, there is provided a method for aligning a mask pattern and a photosensitive substrate with each other in a projection exposure apparatus having a projection optical system for projecting an image of the mask pattern onto the photosensitive substrate, and an off-axis alignment system for detecting a position of a positioning mark on the photosensitive substrate irrespective of the projection optical system. The position of the positioning mark is detected by the off-axis alignment system, and the mask pattern and the photosensitive substrate are aligned with each other based on the detected position of the positioning mark. The projection exposure apparatus also has a first oblique-incidence focus detecting system for applying a first ray of light to the photosensitive substrate obliquely to an optical axis of the projection optical system to measure a deviation along the optical axis between an image plane of projection optical system and a surface of the photosensitive substrate.

The projection exposure apparatus also has a second focus detecting system for applying a second ray of light to the photosensitive substrate within an observation region of the off-axis alignment system on the photosensitive substrate and detecting and photoelectrically converting the second ray of light reflected by photosensitive substrate into a detected signal to measure a deviation between a focused plane of the off-axis alignment system and the surface of the photosensitive substrate based on the detected signal. According to the above method, a predetermined measurement spot on the photosensitive substrate is aligned with the focused plane of the off-axis alignment system based on a deviation, measured by the first oblique-incidence focus detecting system, of the predetermined measurement spot from the image plane of the projection optical system. Then, a detected signal produced by the second focus detecting system when the second ray of light is applied to the photosensitive substrate near the predetermined measurement spot is stored as a reference detected signal while the predetermined measurement spot is being aligned with a center of the observation region of the off-axis alignment system. Then, when the position of the positioning mark is detected with the off-axis alignment system, the detected signal produced by the second focus detecting system is set to the reference detected signal.

Preferably, when the position of the positioning mark is detected, images of a plurality of measuring patterns are projected onto the photosensitive substrate from the second focus detecting system, and one of the measuring patterns which is selected depending on the position of the positioning mark is measured by the second focus detecting system.

With the above arrangement, before the photosensitive substrate starts being exposed, the measurement spot at the center of the positioning mark is moved, for example, to the center of an exposure field of the projection optical system, and the positional deviation along the optical axis of the photosensitive substrate from the image plane of the projection optical system is measured by the first oblique-incidence focus detecting system. Thereafter, the measured positional deviation is corrected by a first predetermined offset between the image plane of the projection optical system and the focused plane of the off-axis alignment system, and a second predetermined offset relative to the focused plane of the off-axis alignment system due to ambient changes such as an atmospheric pressure change, for thereby bringing the position (focused position) of the measurement spot along the optical axis into alignment with the focused plane of the off-axis alignment system.

Thereafter, with the photosensitive substrate being fixed in height, the measurement spot on the photosensitive substrate is moved to the center of the observation region of the off-axis alignment system, and then a measurement pattern is projected onto the photosensitive substrate near the measurement spot from the second focus detecting system. The position of an image which is formed by an optical system that is not telecentric is stored as a reference position. With the optical system that is not telecentric, when the height of the photosensitive substrate varies, the position of the image thus formed thereby is shifted laterally. Therefore, when the position of any positioning mark on the photosensitive substrate is to be detected by the off-axis alignment system, the position of the image of the positioning mark formed by the second focus detecting system is brought into alignment with the reference position. Even if the photosensitive substrate suffers surface irregularities due to various processing steps, the photosensitive substrate can be automatically focused accurately at all times insofar as the surface irregularities are the same between shot areas on the photosensitive substrate. The photosensitive substrate can thus be aligned with the mask pattern highly accurately.

In the case where the positioning mark is associated with a shot area, a measurement pattern of the shot area is to be detected. In the case where the positioning mark is associated with another shot area, a measurement pattern of the other shot area is to be detected. By thus selecting a measurement pattern, the photosensitive substrate can be focused more accurately.

According to the present invention, there is also provided a position detecting apparatus comprising a position detecting illumination system for applying a first ray of light to a positioning mark disposed on a substrate at a given pitch in a predetermined direction, a photoelectric detector for detecting the first ray of light returning from the positioning mark, a focus detecting illumination system for applying a second ray of light to the positioning mark, a focus detecting reception system for receiving the second ray of light returning from the positioning mark to form an image of the positioning mark, an imaging device for observing and imaging the image of the positioning mark which is formed by the focus detecting reception system, an image signal processor for processing an image signal from the imaging device in a predetermined measuring direction to detect a focused condition of the positioning mark, and a height adjusting device for adjusting a height of the substrate. A position of the positioning mark is detected based on a detected signal from the photoelectric detector after the height of the substrate is adjusted by the height adjusting device to maximize the focused condition of the positioning mark which is detected by the image signal processor. The position detecting apparatus also comprises a field limiting device for limiting an observation field of the imaging device, the observation field having a width extending perpendicularly to the predetermined measuring direction in the image signal processor and limited by an integral multiple of the pitch of the image of the positioning mark in a direction perpendicular to the predetermined measuring direction.

The field limiting device may comprise a field stop disposed in the focus detecting illumination system and lying in a plane which is substantially in conjugate relationship to a surface of the substrate.

Alternatively, the field limiting device may comprise image signal selecting means for extracting a signal representing the observation field from the image signal from the imaging device.

The position detecting illumination system and the focus detecting illumination system may comprise an integral illumination system, and the position detecting apparatus may further comprise a striped pattern disposed at a given pitch in the predetermined measuring direction in the image signal processor, the striped pattern being disposed in a plane which is substantially in conjugate relationship to a surface of the substrate, within the integral illumination system.

According to the present invention, there is further provided an apparatus for detecting a position of a surface to be detected in a direction normal to the surface to be detected, comprising a detection optical system for forming an image of a pattern disposed on the surface to be detected based on a ray of light from the pattern, a coma imparting optical system for generating coma with respect to the image formed by the detection optical system, and a detector for detecting the position of the surface to be detected in a direction normal to the surface to be detected, based on an asymmetrical extent of the image of the pattern.

The coma imparting optical system should preferably generate coma in a direction to measure the asymmetrical extent of the image of the pattern.

The apparatus may further comprise an observation optical system for forming an image in an observation field which contains the pattern disposed on the surface to be detected, the coma imparting optical system being positioned outside of a path of a focusing ray of light of the observation optical system.

According to the present invention, there is also provided an apparatus for detecting a position of a surface to be detected in a direction normal to the surface to be detected, comprising an illumination system for irradiating a pattern plate having a pattern to be detected which is arranged in a predetermined measuring direction, a projection optical system for projecting a defocused image of the pattern to be detected onto the surface to be detected, a light dividing system for dividing a ray of light from the surface to be detected into two rays of light, a detection optical system for forming an image of the pattern to be detected based on one of the two rays of light from the light dividing system, an observation optical system for forming an observation image on the surface to be detected based on the other of the two rays of light from the light dividing system, a coma imparting optical system disposed in the detection optical system for generating coma with respect to the image of the pattern to be detected, and a detector for detecting the position of the surface to be detected in a direction normal to the surface to be detected, based on an asymmetrical extent of the image of the pattern in the predetermined measuring direction.

According to the present invention, there is further provided a projection exposure apparatus comprising a projection optical system for projecting an image of a mask pattern onto a photosensitive substrate, a substrate stage for moving the photosensitive substrate in a direction perpendicularly to an optical axis of the projection optical system, an observation optical system for forming an image of a positioning mark on the photosensitive substrate, a position detecting device for detecting a position, near the positioning mark, of the photosensitive substrate along the optical axis of the projection optical system, and a height adjusting device for adjusting a relative position between the photosensitive substrate and the observation optical system along the optical axis of the projection optical system. The photosensitive substrate is positioned based on a position of the image of the positioning mark which is formed by the observation optical system after the photosensitive substrate is brought into focus with the observation optical system by the position adjusting device based on the position detected by the position adjusting device.

The position detecting device comprises a detection optical system for forming an image of at least one of the positioning mark and the image of the mask pattern projected onto the photosensitive substrate, and a coma imparting optical system for generating coma with respect to the image formed by the detection optical system. The projection exposure apparatus also comprises a detector for detecting a position of a surface of the photosensitive substrate along the optical axis of the projection optical system, based on an asymmetrical extent of the image of the mask pattern.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

[1st Embodiment]

The conventional projection exposure system with the off-axis alignment sensor effects automatic focusing and leveling on the wafer based on the measure at only the exposure position, i.e., the exposure field of the projection optical system. Therefore, if the position of the image plane of the projection optical system and the best focused position of an observation microscope in the off-axis alignment sensor are brought out of alignment with each other due to atmospheric pressure variations or the like, then even when the exposure surface of the wafer is aligned with the image plane of the projection optical system by an automatic focusing system, the off-axis alignment sensor detects a defocused condition, and the position of the wafer mark is detected with reduced accuracy.

Continued exposure tends to bring about thermal strains on account of the continued application of exposure light, causing the image plane of the projection optical system to change in position along the optical axis thereof. However, since the best focused position of the off-axis alignment sensor remains unchanged even with the positional change of the image plane of the projection optical system, the off-axis alignment sensor will detects the wafer out of focus when the exposure surface of the wafer is aligned with the image plane of the projection optical system.

One solution is to equip the off-axis alignment sensor with a dedicated TTL automatic focusing mechanism. However, inasmuch as the numerical aperture of the objective of the alignment sensor cannot be substantially increased due to space limitations, an automatic focusing light beam cannot be applied to the wafer at a large incident angle. In this case, part of the automatic focusing light beam is reflected by the upper surface of the photoresist on the wafer, whereas much of the remainder of the automatic focusing light beam passes through the photoresist and is reflected by a surface of the wafer beneath the photoresist. If the surface of the wafer beneath the photoresist suffers refractive index irregularities, then the reflected light has an irregular distribution of intensities, possibly lowering the accuracy of the automatic focusing process.

An alignment system according to a first embodiment of the present invention will be described below. The alignment system according to the first embodiment employs an off-axis alignment sensor which is incorporated in a projection exposure apparatus known as a stepper which transfers the pattern image of a reticle successively to shot areas on a wafer that has been coated with a photoresist according to a step-and-repeat process.

Figure 1:
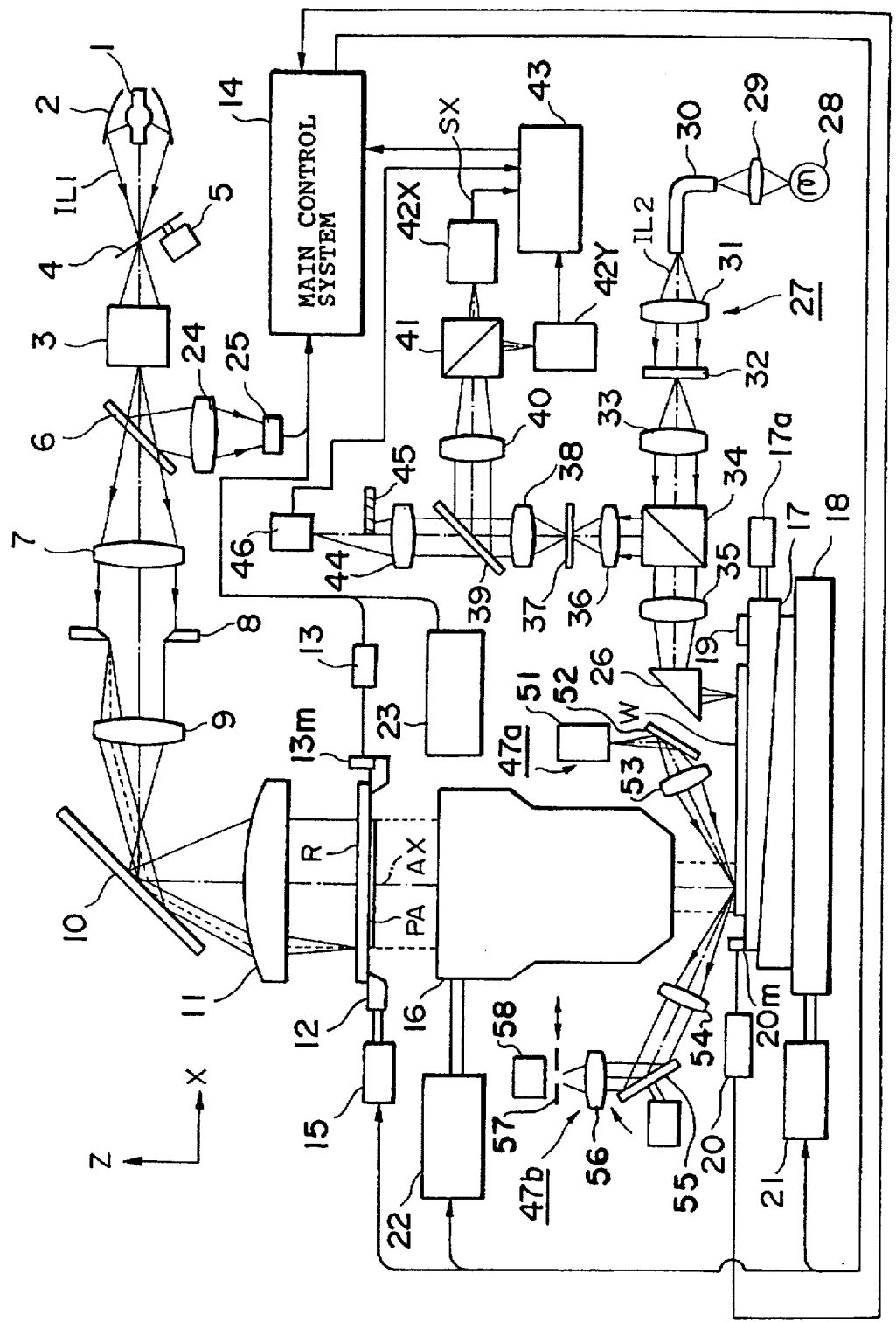
FIG. 1 is a side elevational view, partly in block form, of a projection exposure apparatus which incorporates an alignment system according to a first embodiment of the present invention.

FIG. 1 schematically shows the projection exposure apparatus, partly in block form. As shown in FIG. 1, exposure light IL1 generated by an ultrahigh-pressure mercury lamp 1 is reflected by an elliptical mirror 2 and converged at the second focal point of the elliptical mirror 2. The exposure light IL1 is then applied to an optical system 3 for uniformizing an illuminance distribution, which is composed of a collimator lens, an interference filter, an optical integrator (fly's eye lens), and an aperture stop ($\sigma$ stop). Adjacent to the second focal point of the elliptical mirror 2, there is disposed a shutter 4 such as a four-blade rotary shutter which is actuatable by a motor 5 for selectively closing and opening the path of the exposure light IL1 from the elliptical mirror 2. The exposure light IL1 may be a bright line such as an i-line of the emission from the mercury lamp 1, or a laser beam from a Krf excimer laser or an ArF excimer laser, or a harmonic emission from a metal vapor laser or a YAG laser.

The exposure light IL1 which is emitted from the optical system 3 has a wavelength band capable of sensitizing the photoresist layer on the wafer W. Most of the exposure light IL1 passes through a beam splitter 6, a first relay lens 7, a variable field stop (reticle blind) 8, and a second relay lens 9 to a mirror 10. The exposure light IL1 is then reflected substantially downwardly by the mirror 10, passes through a main condenser lens 11, and irradiates a pattern area PA of a reticle R with a substantially uniform illuminance distribution. The plane in which the reticle blind 8 lies and the plane in which the pattern area PA of the reticle R are in conjugate relationship, i.e., image-forming relationship, to each other.

The reticle R is mounted on a reticle stage 12 which can be slightly moved along the optical axis AX of a projection optical system 16 by a drive motor 15 and can also be two-dimensionally moved and slightly rotated in a horizontal plane. To an end of the reticle stage 12, there is fixed a movable mirror 13m for reflecting a laser beam emitted from a laser beam interference comparator (hereinafter referred to as an "interferometer") 13. The two-dimensional position of the reticle stage 12 is detected at all times by the interferometer 13 at a resolution of about 0.01 µm, for example. A reticle alignment system (not shown) is disposed over the reticle R for detecting two alignment marks on the reticle R near its outer circumferential edge. Based on a detected signal from the reticle alignment system, the reticle stage 12 is slightly moved to position the reticle R such that the center of the pattern area PA thereof will be aligned with the optical axis AX.

The exposure light IL1 that has passed through the pattern area PA of the reticle R is applied to the projection optical system 16 which is of a dual telecentric configuration. The projection optical system 16 forms a projected image, reduced by ⅕, of a circuit pattern on the reticle R, on the wafer W in superposed relationship to one of shot areas on its surface which is coated with the photoresist layer and held in substantial alignment with the image plane of the projection optical system 16.

Figure 2:
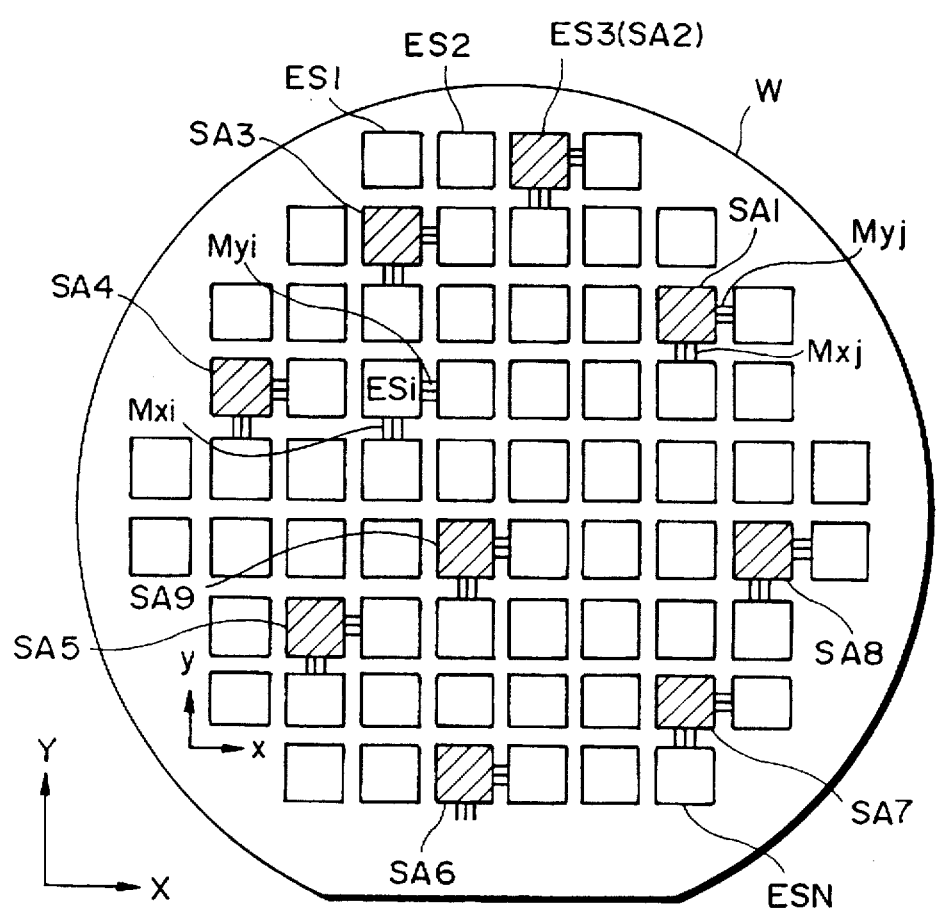
FIG. 2 is a plan view of a wafer to be exposed, showing a matrix of shot areas on the wafer.

FIG. 2 shows a matrix of shot areas ES1~ESN disposed on the wafer W and arranged in a coordinate system (x, y) thereon. Each shot area ESi (i=1~N) is associated with a wafer mark Mxi in the direction indicated by the arrow X and a wafer mark Myi in the direction indicated by the arrow Y, the wafer marks Mxi, Myi being formed in street lines adjacent to the shot area ESi. The wafer mark Mxi is composed of multiple marks arrayed at a given pitch or interval in the direction X, and the wafer mark Myi is composed of multiple marks arrayed at a given pitch or interval in the direction Y. In this embodiment, the wafer W is aligned with the reticle R according to an enhanced global alignment (EGA) process. According to the EGA process, the positions of wafer marks of only selected shot areas (hereinafter referred to as "sample shot areas") SA1~SA9 among all the shot areas ESi are detected by the off-axis alignment sensor, and the detected positions are analytically processed thereby to calculate matrix coordinates of all the shot areas ESi. The wafer W is then aligned with the reticle R based on the calculated matrix coordinates.

As shown in FIG. 1, the wafer W is attracted under vacuum by a wafer holder (not shown) which is rotatable through small angles, and held on a Z stage 17 by the wafer holder. The Z stage 17 is mounted on an X-Y stage 18. A main control system 14 which controls overall operation of the projection exposure apparatus energizes a drive motor 21 to actuate the X-Y stage 18 according to a step-and-repeat process for thereby two-dimensionally moving the wafer W in an X-Y plane perpendicular to the optical axis AX of the projection optical system 16. The Z stage 17 can be actuated by a drive motor 17a to position the wafer W in the direction indicated by the arrow Z parallel to the optical axis AX of the projection optical system 16. The Z stage 17 includes a leveling stage for horizontally leveling the wafer W. After the circuit pattern on the reticle R is transferred to one of the shot area on the wafer W through the projection optical system 16, the wafer W is stepped by the X-Y stage 18 to bring a next shot area thereon into alignment with the projection optical system 16. A movable mirror 20m for reflecting a laser beam from an interferometer 20 is fixed to an end of the Z stage 17. The two-dimensional position of the Z stage 17 is detected at all times by the interferometer 20 at a resolution of about 0.01 μm, for example.

A reference member 19 which comprises a glass plate having a reference mark thereon for measuring a base line is mounted on the Z stage 17. The reference member 19 has an upper surface lying flush with the upper exposure surface of the wafer W. While the position of the wafer W in the direction Z is being varied by the Z stage 17, the reference mark on the reference member 19 is observed and imaged by an off-axis alignment sensor 27 (described later on in detail), and the best focused position of the off-axis alignment sensor 27 is determined from the position in which the contrast of the image of the reference mark is the greatest. The reference mark on the reference member 19 may comprise multiple marks as with the wafer marks.

The image plane of the projection optical system 16 may be determined using, for example, a test print or a light-emitting mark (not shown) in the Z stage 17 which supports the wafer W.

After the position of the reference mark on the reference member 19 is detected by the off-axis alignment sensor 27, the position of the reference mark on the reference member 19 is detected by a TTL observation system (not shown) through the projection optical system 16. In this manner, the deviation or difference between the optical axis of the projection optical system 16 and the optical axis of the off-axis alignment sensor 27 can be determined as a base line. When the position of a certain wafer mark on the wafer W is detected by the off-axis alignment sensor 27 and the base line is added to the detected position of the wafer mark, a shot area with which the wafer mark is associated can be positioned in the exposure field of the projection optical system 16.

The projection exposure apparatus also includes an imaging characteristic corrector 22 for adjusting imaging characteristics of the projection optical system 16. The imaging characteristic corrector 22 has piezoelectric elements for independently actuating some lens elements in the projection optical system 16 which are close to the reticle R, in a direction parallel or obliquely to the optical axis AX thereby to correct imaging characteristics of the projection optical system 16, e.g., a projection magnification or a distortion. The imaging characteristics of the projection optical system 16, e.g., the position of its imaging plane (focused position), vary depending on the ambient atmospheric pressure and temperature, and the period of time during which the exposure light is applied to the projection optical system 16 or, more accurately, the amount of thermal energy stored by the projection optical system 16 upon absorption of the exposure light. Likewise, the best focused position of the off-axis alignment sensor 27 also varies with the ambient atmospheric pressure and temperature.

An ambient sensor 23 is positioned intermediate between the projection optical system 16 and the off-axis alignment sensor 27 for measuring the ambient atmospheric pressure and temperature at all times. The ambient atmospheric pressure and temperature detected by the ambient sensor 23 are supplied to the main control system 14. The main control system 14 determines, from the supplied ambient atmospheric pressure and temperature, changes in the imaging characteristics of the projection optical system 16, a change in the position of the image plane thereof, and at the same time a change in the best focused position of the off-axis alignment sensor 27 according to experimentally established formulas. Then, the main control system 14 controls the imaging characteristic corrector 22 to correct the imaging characteristics of the projection optical system 16 to eliminate their changes. To eliminate changes in the image plane of the projection optical system 16 and the best focused position of the off-axis alignment sensor 27, the main control system 14 controls the Z stage 17 to establish a focused position of the wafer W independently with respective AF sensors when the wafer W is exposed and aligned, as described later on.

The exposure light IL1 which is reflected by the beam splitter 6 passes through a condenser lens 24 and is detected by a photoelectric detector 25, which supplies a photoelectrically converted signal to the main control system 14. Based on the predetermined relationship between the amount of light detected by the photoelectric detector 25 and the amount of exposure light energy applied to the exposure surface of the wafer W, the main control system 14 can monitor an integrated amount of exposure light applied to the wafer W from an integrated quantity of the photoelectrically converted signal from the photoelectric detector 25. Since the amount of exposure light that passes through the projection optical system 16 can be recognized from the integrated amount of exposure light applied to the wafer W, the main control system 14 determines changes in the imaging characteristics of the projection optical system 16 and a change in the position of the image plane thereof from the integrated quantity of the photoelectrically converted signal from the photoelectric detector 25, and corrects the imaging characteristics of the projection optical system 16 and the position of the image plane thereof in the manner described above.

The projection exposure apparatus further includes an exposure focused position detection system (hereinafter referred to as a "main AF (automatic focusing) sensor") for measuring the position of the exposure surface of the wafer W. The main AF sensor, the Z stage 17, and the main control system 14 jointly operate to automatically bring the wafer W into focus with respect to the projection optical system 16. The main AF sensor comprises a light-transmitting system 47a and a light-detecting system 47b which are positioned one on each side of the projection optical system 16.

Figure 3:
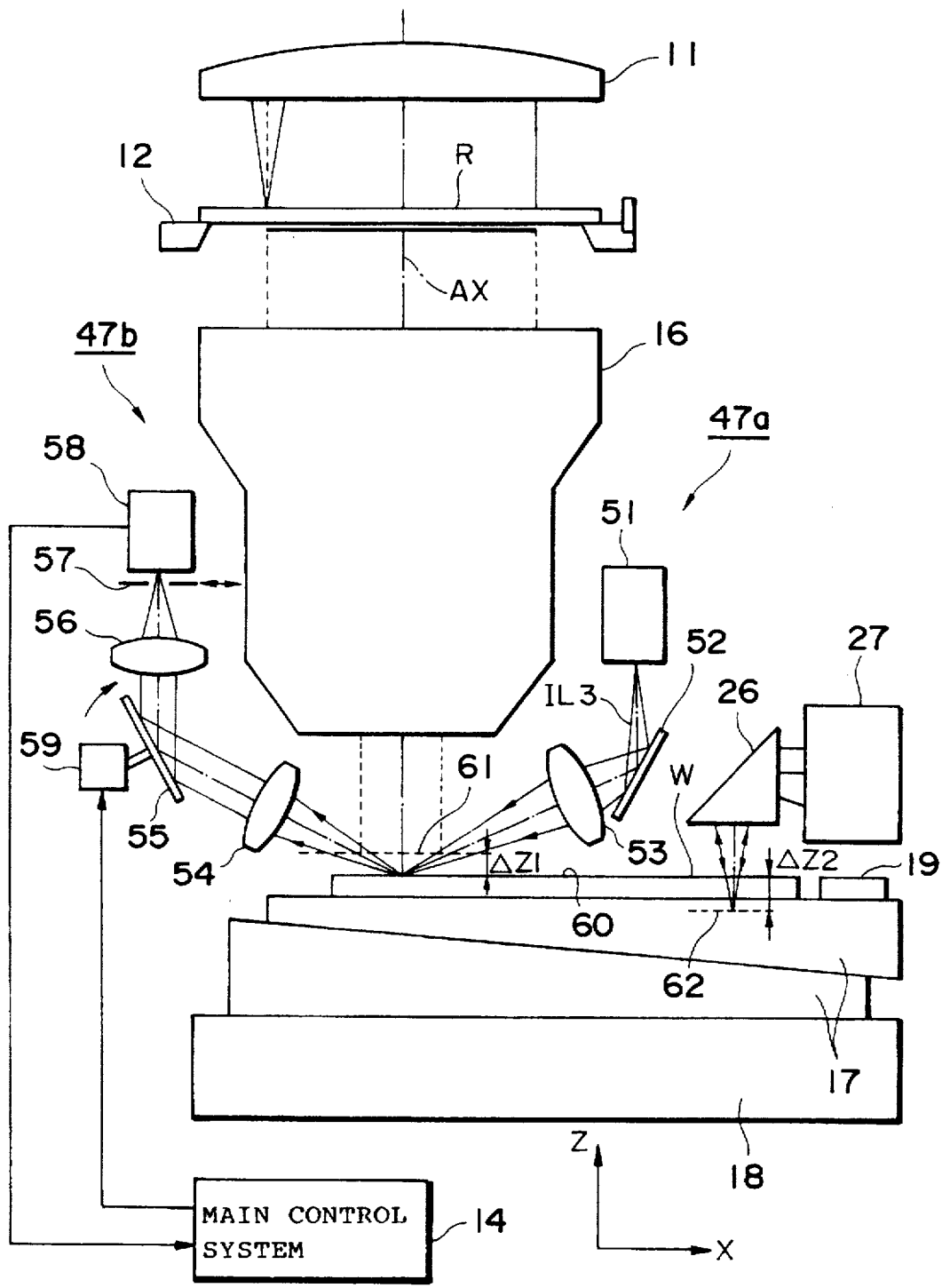
FIG. 3 is an enlarged side elevational view of a main AF sensor in the projection exposure apparatus shown in FIG. 1.

FIG. 3 shows the main AF sensor at an enlarged scale. As shown in FIG. 3, the light-transmitting system 47a comprises a light-emitting element 51, a mirror 52, and a condenser objective 53, and the light-detecting system 47b comprises a condenser objective 54, a tiltable mirror 55, a focusing lens 56, an oscillatory slit 57, and a photoelectric detector 58. The light-transmitting system 47a includes an aperture pattern comprising a slit pattern positioned in front of the light-emitting element 51. Detection light, e.g., light which does not sensitize the photoresist layer on the wafer W, IL3 emitted by the light-emitting element 51 and having passed through the slit pattern is applied to the exposure surface of the wafer W (or the marked surface of the reference member 19) through the mirror 52 and the condenser objective 53 obliquely to the optical axis AX of the projection optical system 16, thereby projecting a slit pattern image onto the exposure surface of the wafer W. The detection light that is reflected by the exposure surface of the wafer W travels through the condenser objective 54, the tiltable mirror 55, the focusing lens 56, and the oscillatory slit 57, forming a slit pattern image again on a slit defined in the light-detecting surface of the photoelectric detector 58. The light which has passed through the slit is photoelectrically converted into a detected signal, which is rectified into a focusing signal in synchronism with a drive signal that is applied to actuate the oscillatory slit 57.

The slit pattern image formed on the exposure surface of the wafer W has its longitudinal direction normal to the sheet of FIG. 3. When the exposure surface of the wafer W is displaced in the direction Z, the slit pattern image on the light-detecting surface of the photoelectric detector 58 is displaced in the direction X. Therefore, since the focusing signal outputted from the photoelectric detector 58 varies substantially linearly with respect to the focused position of the exposure surface of the wafer W within a certain range, the focused position of the exposure surface of the wafer W can be detected from the focusing signal. When the tiltable mirror 55 is turned about an axis normal to the sheet of FIG. 3, the slit pattern image on the light-detecting surface of the photoelectric detector 58 is displaced in the direction X. The main control system 14 controls an actuator 59 to determine an angle at which the tiltable mirror 55 is tilted. When the exposure surface of the wafer W is positioned in the best image plane of the projection optical system 16 which has been achieved in the direction Z as described above, the mirror 55 is tilted to align the center of the slit pattern image with the center of the slit in the light-detecting surface of the photoelectric detector 58. This process is to set the focus signal to a zero-cross point, for example, thereby calibrating the main AF sensor that is composed of the light-transmitting system 47a and the light-detecting system 47b.

The off-axis alignment sensor 27 will be described in detail below. As shown in FIG. 1, the off-axis alignment sensor 27 is positioned, together with a prism mirror 26, on one side of the projection optical system 16. In the off-axis alignment sensor 27, illumination light IL2 emitted from a halogen lamp 28 passes through a condenser lens 29 to one end of an optical fiber 30. The illumination light IL2 which has passed through the optical fiber 30 and left the other end thereof travels through a lens 31 and irradiates an illumination field stop plate 32.

Figure 4:
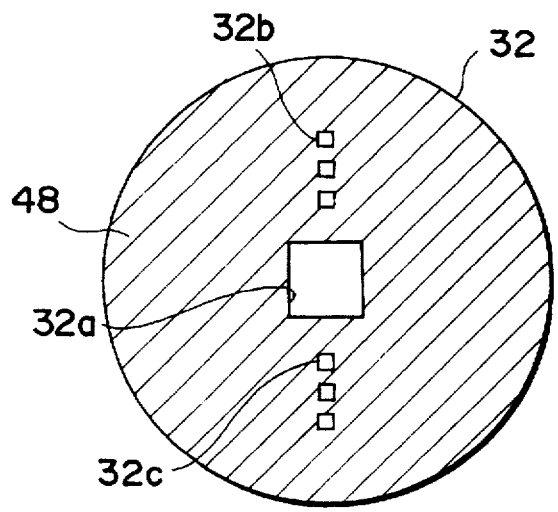
FIG. 4 and 5 are views of an illumination field stop plate in the alignment system shown in FIG. 1.

FIG. 4 shows the illumination field stop plate 32 in detail. As shown in FIG. 4, the illumination field stop plate 32 comprises a circular glass plate having a light-shield film 48 disposed thereon. The light-shield film 48 has a central field pattern 32a in the form of a rectangular opening and a pair of upper and lower AF patterns 32b, 32c positioned respectively above and below the central field pattern 32a. Each of the upper and lower AF patterns 32b, 32c comprises an array of small square dot openings spaced at a given pitch. The illumination light that has passed through the central field pattern 32a defines an illumination area for covering a wafer mark to be detected on the wafer W, and the illumination light that has passed through the upper and lower AF patterns 32b, 32c projects images thereof onto the wafer W at respective positions above and below the wafer mark.

Figure 5:
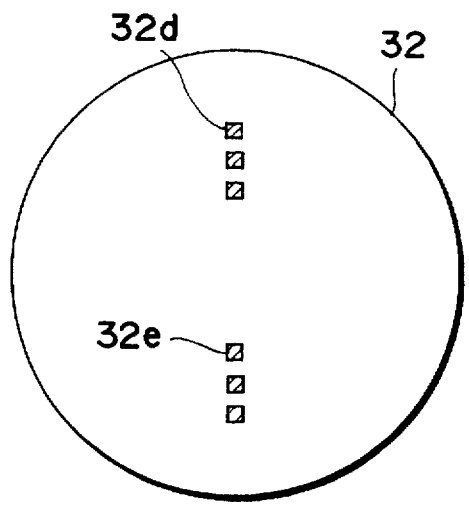
Figure 6:
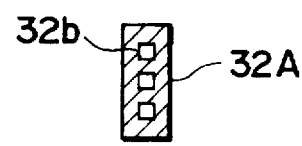
FIG. 6 is a view of two light-shield pattern plates that can be used in place of the illumination field stop plate.

As shown in FIG. 5, the illumination field stop plate 32 may comprise a circular glass plate having a pair of upper and lower AF patterns 32d, 32e each comprising an array of small square light-shield dots spaced at a given pitch. Alternatively, as shown in FIG. 6, two light-shield pattern plates 32A, 32B having respective AF patterns 32b, 32c identical to those shown in FIG. 4 may be used in place of the illumination field stop plate 32 shown in FIG. 4.

Figure 7:
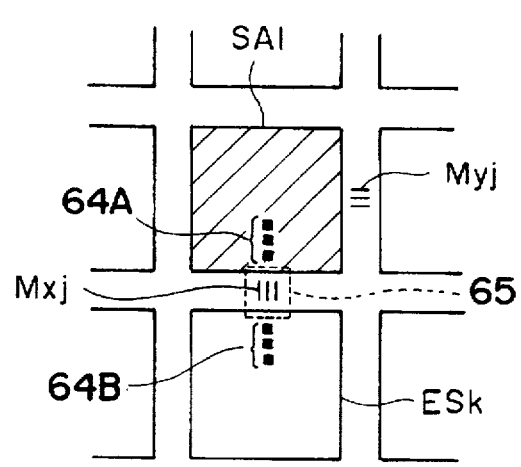
FIG. 7 is an enlarged fragmentary plan view of a sample shot area and its surrounding areas on the wafer to be exposed.

Referring back to FIG. 1, the illumination light IL2 that has passed through the patterns on the illumination field stop plate 32 travels through a lens 33, a half-silvered prism 34, and an objective 35, and is applied to and reflected by the prism mirror 26 to irradiate a wafer mark and its surrounding region on the wafer W in a direction substantially perpendicular to the wafer W. The exposure surface of the wafer W and the plane in which the illumination field stop plate 32 lies are substantially in conjugate relationship to each other. If a wafer mark Mxj (see FIG. 2) associated with a sample shot area SA in the direction X is positioned directly below the prism mirror 26, then, as shown in FIG. 7, the illumination light IL2 irradiates a rectangular illuminated region 65 around the wafer mark Mxj. The illuminated region 65 is in conjugate relationship to the central field pattern 32a on the illumination field stop plate 32 shown in FIG. 4.

Figures 8, 9:
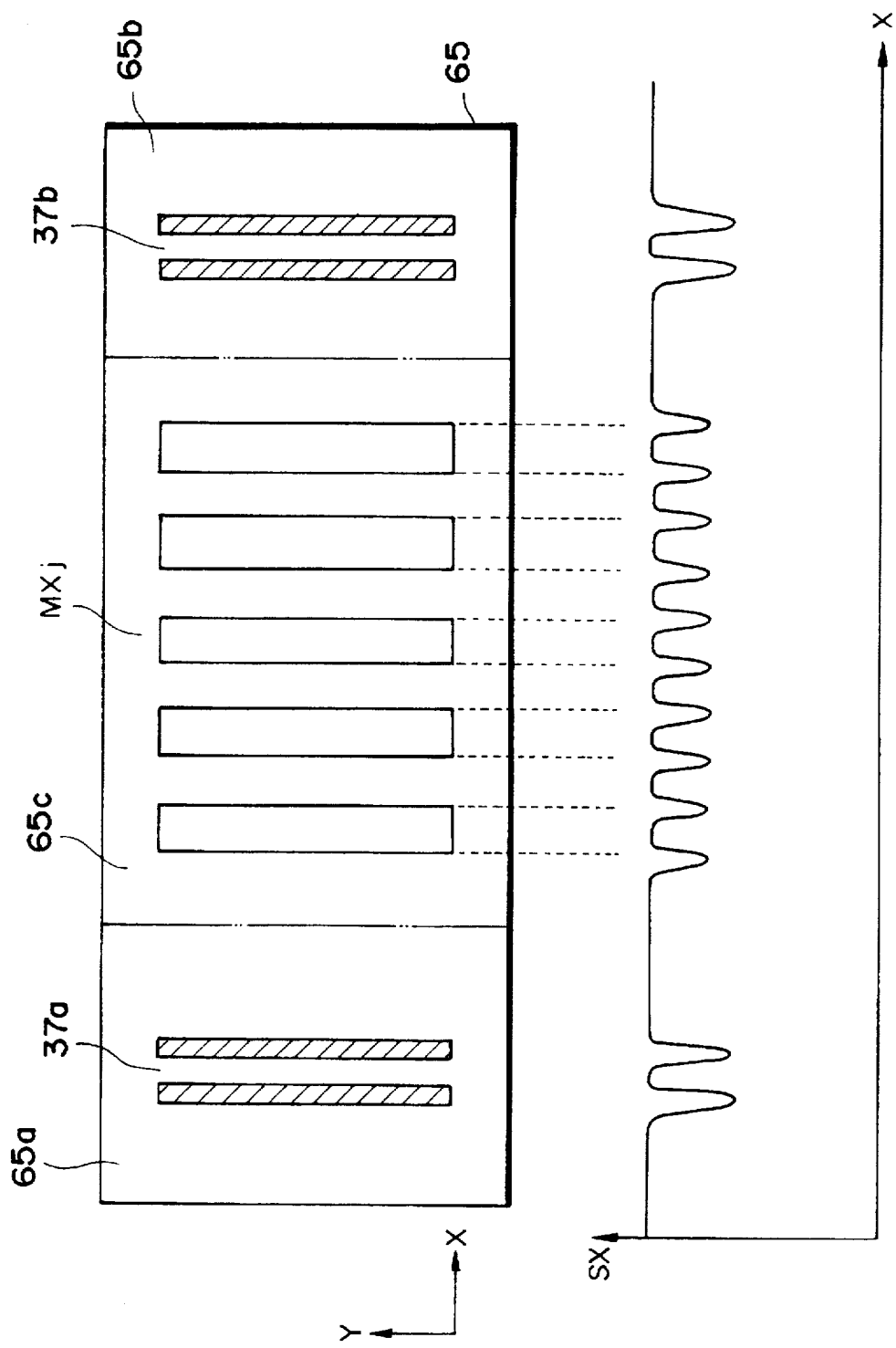
FIG. 8 is a view showing a wafer mark and reference marks as they are observed by an imaging device.
FIG. 9 is a diagram showing the waveform of an image signal representing the wafer mark and reference marks shown in FIG. 8.

When a wafer mark on the wafer W is irradiated by the illumination light IL2, light reflected by the wafer mark travels back through the prism mirror 26 and the objective 35 to the half-silvered prism 34, which then reflects the light through a focusing lens 36 to a reference plate 37, forming an image of the wafer mark on the reference plate 37. As shown in FIG. 8, the reference plate 37 has reference marks 37a, 37b arranged in the direction X and reference marks arranged in the direction Y. Each of the reference marks 37a, 37b comprises two linear patterns extending in the direction Y and spaced at a given distance in the direction X.

As shown in FIG. 1, the reference plate 37 lies in a plane which is substantially in conjugate relationship to the exposure surface of the wafer W with respect to the objective 35 and the focusing lens 36. Therefore, the image of the wafer mark on the wafer W is focused on the reference plate 37. Light from the reference plate 37, which represents the images of the wafer mark and the reference marks, passes through a relay system 38, a beam splitter 39, a relay system 40, and a half-silvered prism 41, and then reaches imaging surfaces of imaging devices 42X, 42Y each comprising a two-dimensional CCD camera or the like. Therefore, the image of the wafer mark and the image of the reference marks are formed on the imaging surfaces of the imaging devices 42X, 42Y. The imaging devices 42X, 42Y produce respective image signals SX, SY which are supplied to a signal processor 43. Based on the supplied image signals SX, SY, the signal processor 43 detects a positional deviation or error between the reference marks on the reference plate 37 and the wafer mark, and supplies the detected positional error to the main control system 14. The imaging device 42X scans the image on its imaging surface with a scanning line extending in the direction X, and the imaging device 42Y scans the image on its imaging surface with a scanning line extending in the direction Y. Consequently, the position of the wafer mark Mxj, for example, in the direction X which is associated with the sample shot area SA1 shown in FIG. 2 is detected on the basis of the image signal SX from the imaging device 42X, and the position of a wafer mark Myj in the direction Y which is also associated with the sample shot area SA1 is detected on the basis of the image signal SY from the imaging device 42Y. The reference marks 37a, 37b on the reference plate 37 are used to reduce drifts of the positions where the images start being scanned by the imaging devices 42X, 42Y.

The wafer mark Mxj on the wafer W as it is observed in the observation field of the imaging device 42X is illustrated in FIG. 8. In FIG. 8, the illuminated region 65 on the wafer W is composed of a region 65c corresponding to the wafer mark Mxj and a pair of regions 65a, 65b positioned one on each side of the region 65c and substantially corresponding to the respective reference marks 37a, 37b on the reference plate 37. The illuminated region 65 is defined to cover these regions 65a, 65b because light returning from the regions 65a, 65b on the wafer W is employed to irradiate the reference marks 37a, 37b on the reference plate 37. Therefore, the regions 65a, 65b are free of any circuit patterns and marks so that no noise will be introduced into the light which irradiates the reference marks 37a, 37b, and are normally processed with a mirror finish. Regions free of any circuit patterns and marks, such as these regions 65a, 65b, will hereinafter be referred to as "inhibit zones".

The image signal SX from the imaging device 42X, which represents the wafer mark Mxj and the reference marks 37a, 37b, has a waveform shown in FIG. 9. The vertical axis of the graph shown in FIG. 9 indicates the intensity of the signal, and the horizontal axis thereof indicates the scanned position in the direction X of the X-Y stage 18 shown in FIG. 1. As shown in FIG. 9, the image signal SX from the imaging device 42X has a bottom level at positions corresponding to the reference marks 37a, 37b and positions (pixel positions) corresponding the edges of the wafer mark Mxj. The reference plate 37 also has reference marks arranged in the direction Y, as described above. The positions of these reference marks in the direction Y and the position of the wafer mark Myj in the direction Y are detected by the imaging device 42Y.

The off-axis alignment sensor 27 has an alignment focused position detection system (hereinafter referred to as an "alignment AF sensor") for automatically focusing on a wafer mark through the objective 35 based on the TTL principle. The lens 31, the field pattern 32a on the illumination field stop plate 32, the lens 33, and the objective lens 35 serve as a light-transmitting system of the alignment AF sensor.

As shown in FIG. 7, two AF mark images 64A, 64B each composed of an array of dots arranged at a given pitch in the direction Y are projected onto the wafer W at respective positions above and below the illuminated region 65 around the wafer mark Mxj. These AF mark images 64A, 64B are conjugate images of the respective AF patterns 32b, 32c shown in FIG. 4. The AF mark image 64A is projected onto the wafer W in the sample shot area SA1 with which the wafer mark Mxj is associated, and the other AF mark image 64B is projected onto the wafer W in a lower shot area ESk adjacent to the sample shot area SA1. In this embodiment, the AF mark image 64A projected in the sample shot area SA1 is used to automatically focus the wafer mark Mxj with respect to the off-axis alignment sensor 27. However, if the wafer mark Mxj is associated with the lower shot area ESk, then the AF mark image 64B projected the lower shot area ESk is used to automatically focus the wafer mark Mxj with respect to the off-axis alignment sensor 27. Therefore, even when the wafer mark to be detected changes its position with respect to shot areas, the wafer mark can automatically be focused accurately with respect to the off-axis alignment sensor 27.

As shown in FIG. 1, reflected light (hereinafter referred to as "AF reflected light") from the AF mark images on the wafer W travels back through the prism mirror 26 and the objective 35 to the half-silvered prism 34, which then reflects the light through the focusing lens 36 to the reference plate 37, forming AM mark images on the reference plate 37. The AF reflected light that has passed through the reference plate 37 passes through the relay system 38, the beam splitter 39, an AF relay system 44, and a half beam shield plate 45, and is applied to an imaging device 46 which comprises a one-dimensional CCD or the like, forming AF mark images on the imaging surface of the imaging device 46. Therefore, the objective 35, the focusing lens 36, the relay system 38, the beam splitter 39, the AF relay system 44, the half beam shield plate 45, and the imaging device 46 jointly make up a light-detecting system of the alignment AF sensor. Based on an image signal produced by the imaging device 46, the signal processor 43 detects one of the positions of the AF mark images on the imaging surface of the imaging device 46, and supplies positional information indicative of the detected position to the main control system 14. At this time, the signal processor 43 selects the AF mark image corresponding to the AF mark image 64A shown in FIG. 7 from the AF mark images formed on the imaging surface of the imaging device 46, and detects the position of only the selected AF mark image.

Operation of the half beam shield plate 45 will be described below. As shown in FIG. 1, the half beam shield plate 45 covers a half (see FIG. 10) of the AF relay system 44 on the right-hand side of an optical axis AX2 of the light-detecting system of the alignment AF sensor. Consequently, a principal ray of the AF reflected light directed from the AF relay system 44 toward the imaging surface of the imaging device 46 is applied obliquely to the imaging surface of the imaging device 46. The light-detecting system of the alignment AF sensor is not telecentric in the direction indicated by the arrow M. When the wafer W is vertically moved to change the position (focused position) of its surface in the direction Z, the AF mark image on the imaging surface of the imaging device 46 is displaced laterally.

Figure 10:
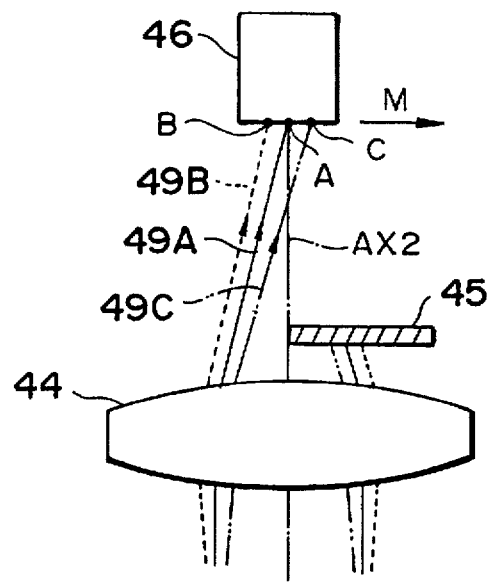
FIG. 10 is a view illustrative of the principles of a process of detecting a change in a focused position by an alignment AF sensor of the alignment system according to the first embodiment.
Figure 11:
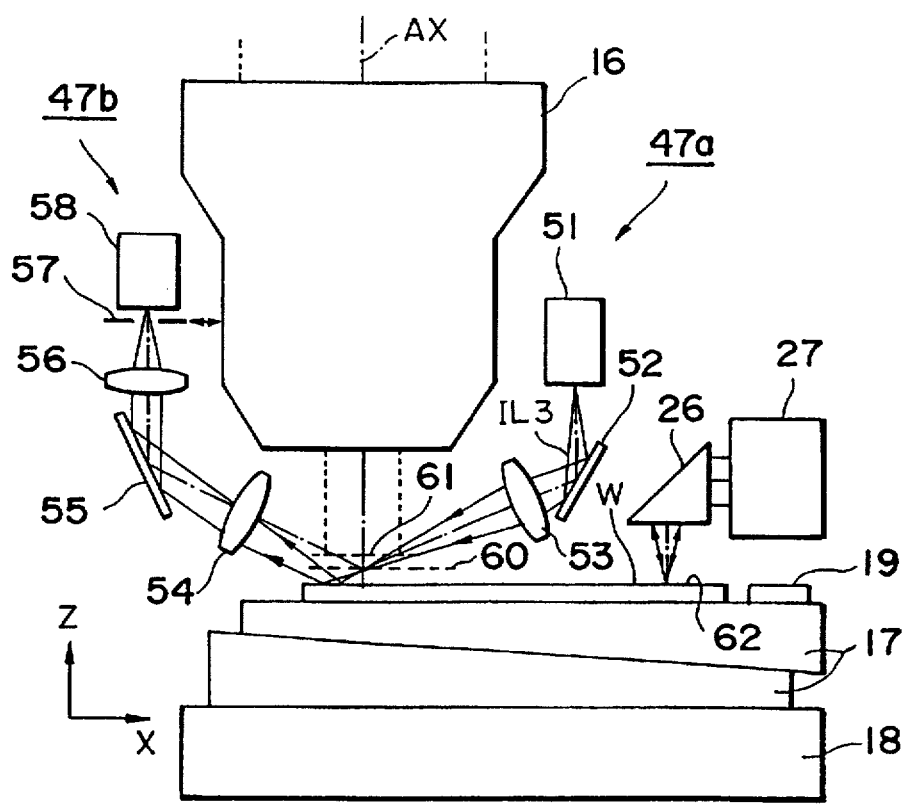
FIG. 11 is a side elevational view showing a focused position when the wafer is aligned with a mask pattern.
Figure 12:
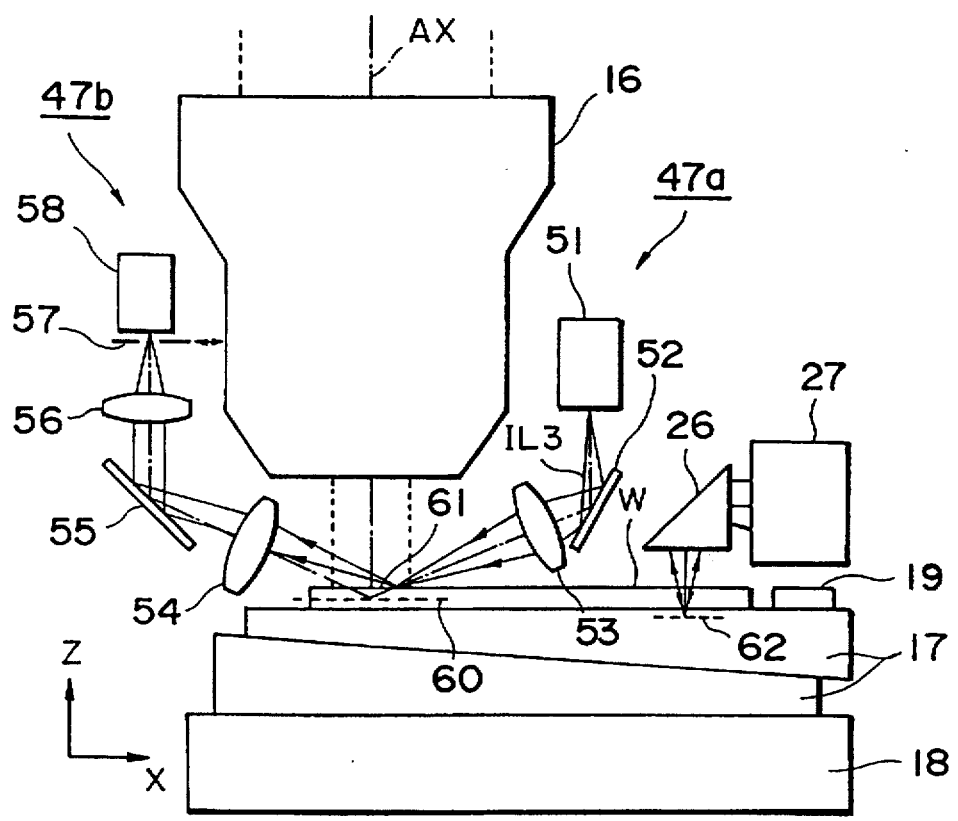
FIG. 12 is a side elevational view showing a focused position when the wafer is exposed.

FIG. 10 shows the AF relay system 44, the half beam shield plate 45, and the imaging device 46 at an enlarged scale. It is assumed that, as shown in FIG. 10, AF reflected light 49A that passes off the axis of the AF relay system 44 parallel to the optical axis AX2 converges onto a point A (AF mark image) on the imaging surface of the imaging device 46 in alignment with the optical axis AX2. If the focused position of the wafer W changes at this time, the AF reflected light 49A becomes a divergent ray of light 49B or a convergent ray of light 49C. The position of the center (AF mark image) of the light intensity distribution on the imaging surface of the imaging device 46 is now shifted laterally to a point B or a point C along the direction M. Inasmuch as the lateral shift of the AF mark image on the imaging surface of the imaging device 46 varies substantially linearly with the focused position of the wafer W, the focused position of the wafer W can be detected when the position of the AF mark image on the imaging surface of the imaging device 46 is detected.

Insofar as the exposure surface of the wafer W is focused with respect to the alignment imaging devices 42X, 42Y, the image corresponding to the AF mark image 64A shown in FIG. 7 is not required to be focused on the imaging surface of the imaging device 46, but the position of the AF mark image on the imaging surface of the imaging device 46 is of importance. When the marked surface of the reference member 19, for example, is positioned in the best focused plane of the off-axis alignment sensor 27, i.e., the alignment imaging devices 42X, 42Y, which has been achieved in the direction Z, the position of the AF mark image formed on the imaging surface of the imaging device 46 is stored as a reference focused position which represents the best focused plane of the off-axis alignment sensor 27. In this manner, the alignment AF sensor is calibrated.

A process of exposing the wafer W will be described below. It is assumed that only the atmospheric pressure is taken into account. The wafer W has been adjusted to bring the position of the image plane of the projection optical system 16 and the best focused position of the off-axis alignment sensor 27 into alignment with each other under a predetermined reference pressure. The main AF sensor, composed of the light-transmitting system 47a and the light-detecting system 47b, has been calibrated such that the focusing signal represents a zero-cross point at the best focused position, and the alignment AF sensor has also been calibrated such that the position of the AF mark image which is formed again by the alignment AF sensor is in a reference focused position (initial value). Before the wafer W is exposed to the exposure light from the projection optical system 16, the main control system 14 measures the ambient pressure around the projection optical system 16 and the off-axis alignment sensor 27 through the ambient sensor 23, and calculates a change $\Delta Z1$ in the image plane of the projection optical system 16 and a change $\Delta Z2$ in the best focused position of the off-axis alignment sensor 27 from the measured deviation from the predetermined reference pressure.

If the focusing signal from the main AF sensor represents a zero-cross point when the exposure surface of the wafer W lies at a reference plane 60 as shown in FIG. 3, then the image plane of the projection optical system 16 has been lifted to a plane 61, for example, by the change $\Delta Z1$, and the best focused position of the off-axis alignment sensor 27 has been lowered to a plane 62, for example, by the change $\Delta Z2$. The main control system 14 calculates the change $\Delta Z1$ from the reference plane 60 to the plane 61 and the change $\Delta Z2$ from the reference plane 60 to the plane 62.

For detecting the positions of the wafer marks associated with the sample shot area SA1, for example, selected from the sample shot areas SA1~SA9 on the wafer W with the off-axis alignment sensor 27, the sample shot area SA1 is moved into the exposure field of the projection optical system 16, and the main control system 14 controls the actuator 59 to tilt the mirror 55 through an angle that corresponds to the change $\Delta Z2$ in the best focused position of the off-axis alignment sensor 27. Then, the main AF sensor is controlled to effect its automatic focusing operation. Now, the focusing signal produced by the light-detecting system 47b of the main AF sensor becomes zero when the exposure surface of the wafer W reaches the plane 62 at the best focused position of the off-axis alignment sensor 27.

Then, the focused sample shot area SA1 is moved to bring the wafer mark Mxj on a street line adjacent to the sample shot area SA1 into the illuminated region 65 irradiated by the off-axis alignment sensor 27. Since the two AF mark images 64A, 64B are formed around the wafer mark Mxj, the AF reflected light reflected from the exposure surface of the wafer W forms AF mark images again on the imaging surface of the imaging device 46. An AF mark image (hereinafter referred to as an "AF mark image in actual use") corresponding to the AF mark image 64A, selected from the two AF mark images 64A, 64B, which is positioned on the sample shot area SA1 with which the wafer mark Mxj is associated has been inputted as an image to be detected to the main control system 14. If an AF mark image is projected onto a street line between shot areas in FIG. 7, then all the AF mark images may be used as AF mark images in actual use.

According to a command signal from the main control system 14, the signal processor 43 detects the position of the AF mark image in actual use from the image signal sent from the imaging device 46, and stores the detected position as a reference focused position (corrected) which represents the best focused position of the off-axis alignment sensor 27 with respect to the sample shot area SA1. The off-axis alignment sensor 27 has now been calibrated with respect to the sample shot area SA1.

If the above correcting process is automatically effected on the alignment AF sensor, then when the positions of the wafer marks associated with the sample shot areas SA2~SA2 are to be detected, the positions of the wafer marks can be detected in the best focused position of the off-axis alignment sensor 27 at all times by carrying out the automatic focusing process to set the position of an AF mark image formed again in the alignment AF sensor to a reference focused position (corrected). This is because the positions where the AF mark images in actual use are irradiated with respect to the respective sample shot areas remain substantially the same, and even if AF mark images formed again on the imaging device 46 are asymmetrically distorted due to reflectance irregularities of the wafer surface below the AF mark images, since the distortions of the AF mark images are essentially the same throughout the sample shot areas, no error occurs in the detection of the focused position. In this manner, the positions of the wafer marks can be detected highly accurately.

Thereafter, the coordinate positions of the shot areas ES1~ESN on the wafer W shown in FIG. 2 are calculated on the basis of the positions of the sample shot areas SA1~SA9, and the shot areas ES1~ESN are positioned in the exposure field of the projection optical system 16 based on the calculated coordinate positions. For exposing the shot areas after they have been positioned, the main control system 14 controls the actuator 59 shown in FIG. 3 to tilt the mirror 55 through an angle corresponding to a change (ΔZ1–ΔZ2) in the focused position. When the main AF sensor is then controlled to effect its automatic focusing operation, the focusing signal produced by the light-detecting system 47b of the main AF sensor becomes zero when the exposure surface of the wafer W reaches the plane 61 at the image plane of the projection optical system 16. When the wafer W is exposed to the exposure light from the projection optical system 16, the circuit pattern of the reticle R is projected onto each of the shot areas on the wafer W with high resolution.

The above automatic correcting process is not required to be carried out with respect to each of wafers to be processed, but may be effected on the first wafer of a lot of wafers. The above automatic correcting process may be carried out in each of processing steps on a wafer, and the reference focused positions for the respective processing steps may be stored in the main control system 14.

In this embodiment, AF pattern images are projected onto a wafer outside of alignment mark regions. However, AF pattern images may be projected onto a wafer within alignment mark regions.

While the AF mark images 64A, 64B are projected onto the wafer in this embodiment, no AF mark images may be projected onto the wafer, but a wafer mark image formed on the imaging device 46 of the alignment AF sensor by the reflected light from the wafer mark Mxj itself may be used instead of AF mark images, and a focused position may be detected from a positional error of the wafer mark image. In this case, the above correcting process should preferably be carried out for each wafer depending on the accuracy of prealignment.

The above correcting process may be reversed to measure an error of the best focused position achieved by the alignment AF sensor with an offset calculating means (the main control system 14) and the main AF sensor, and using the measured error to correct an offset of the alignment AF sensor.

The alignment focused position detection system may be a contrast detection system for detecting the contrast of an AF pattern image when it is defocused, rather than the system, which is not telecentric, for detecting a lateral shift of an AF pattern image. Alternatively, the alignment focused position detection system may be an oblique-incidence system, such as the main AF sensor, for applying a light beam to a wafer from outside of the objective, rather than the TTL system which employs the objective 35. The principles of the present invention are thus effective in various alignment focused position detection systems.

[2nd Embodiment]

Figure 13:
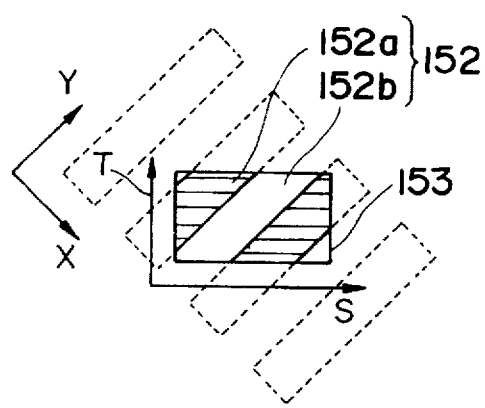
FIGS. 13 and 14 are diagrams showing the principles of a focus detecting process of a conventional focus detecting apparatus.
Figure 14:
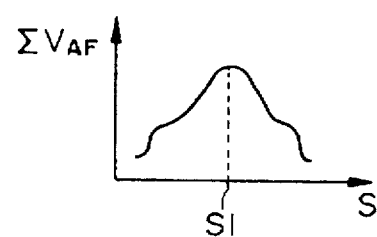

As disclosed in Japanese laid-open patent publication No. 63-90825, a conventional focus detecting apparatus projects a focusing mark onto a mark to be detected. FIGS. 13 and 14 show the principles of a focus detecting process of the conventional focus detecting apparatus. In FIG. 13, a mark 152 to be detected comprises an alternate array of dark strips 152a and bright strips 152 which are spaced in the direction X in which the position of the mark 152 is to be detected. After the mark 152 is roughly positioned by prealignment, an image 153 of a focusing mark is projected onto the mark 152. The projected image 153 of the focusing mark comprises a rectangular bright pattern having parallel sides extending in the direction indicated by the arrow S (hereinafter referred to as a "measuring direction" for measuring the focusing mark) which crosses the direction X at a given angle, and parallel sides extending in the direction indicated by the arrow T (hereinafter referred to as a "non-measuring direction") which extends perpendicularly to the direction S. Reflected light from the projected image 153 is converged by a detection optical system which is not telecentric, for example, forming an image of the projected image 153 on an imaging device again. The projected image 153 of the focusing mark is used to establish an observation field for the mark 152, and the image that is formed again is the image of the mark 152 within the projected image 153.

An image signal $V_{AF}$ which is produced when the image that is formed again is scanned on the imaging device in a direction (also referred to as a "measuring direction S") corresponding to the measuring direction S is integrated in the non-measuring direction perpendicular to the measuring direction S, thereby generating an integral signal $\Sigma V_{AF}$ as shown in FIG. 14. The barycenter of the integral signal $\Sigma V_{AF}$ in the measuring direction S is determined as a reference position S1 while the mark 152 is in focus with a detecting objective. Then, the height of the mark 152 is adjusted to bring the barycenter of the integral signal $\Sigma V_{AF}$ into alignment with the reference position S1 for thereby focusing the mark.

When the projected image 153 of the focusing mark is displaced in position with respect to the mark 152 which is composed of dark and bright strips, the waveform of the integral signal $\Sigma V_{AF}$ varies, failing to focus the mark accurately.

Figure 15:
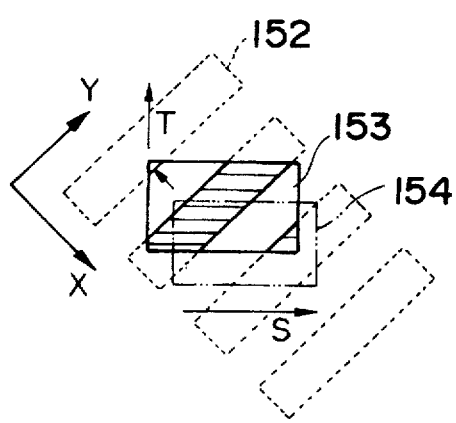
FIGS. 15 and 16 are diagrams showing a condition in which a projected image of a focusing mark is displaced off the position shown in FIGS. 13 and 14.
Figure 16:
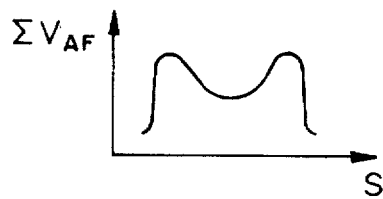

Specifically, when an integral signal $\Sigma V_{AF}$ is produced from an image that is formed again of the projected image 153 after the projected image 153 has been shifted from a position 154 (see FIG. 15) substantially in the direction –X, the integral signal $\Sigma V_{AF}$ has a waveform as shown in FIG. 16. The waveform shown in FIG. 16 greatly differs from the waveform shown in FIG. 14, and has its center shifted from the reference position S1. Therefore, a focus error occurs in a process of focusing the mark based on the deviation of the center of the integral signal $\Sigma V_{AF}$ from the reference position S1.

Because the size of semiconductor integrated circuits becomes smaller and smaller in recent years, demands for higher accuracy of alignment between wafers and mask patterns are increasing. In order to keep alignment accuracy within a demanded range, it is desirable to make any focus error produced at the time of detecting the position of an alignment mark smaller than heretofore.

Figure 17:
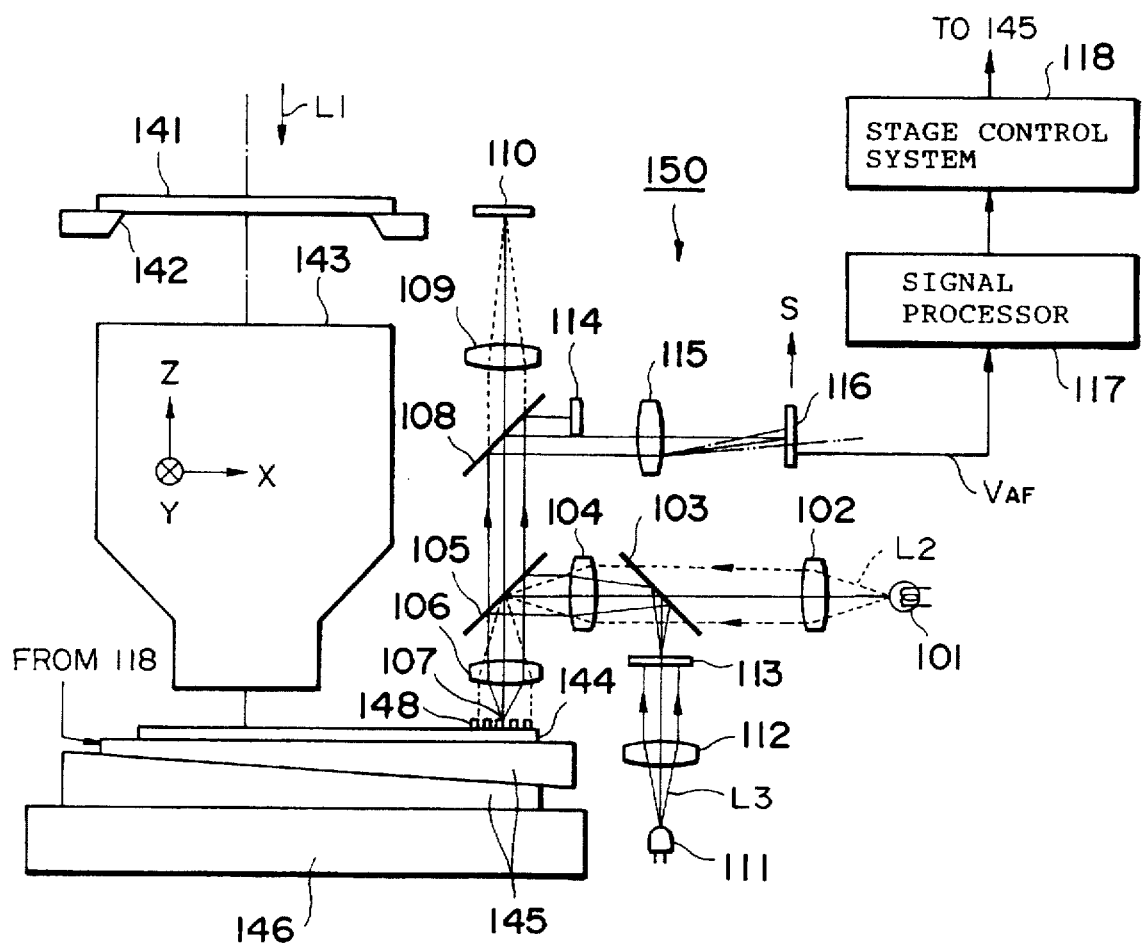
FIG. 17 is a side elevational view, partly in block form, of a projection exposure apparatus which incorporates an alignment system according to a second embodiment of the present invention.

An alignment system according to a second embodiment of the present invention will be described below with reference to FIGS. 17 through 24. The alignment system according to the second embodiment comprises an off-axis alignment system which is incorporated in a projection exposure apparatus for fabricating semiconductor devices. FIG. 17 shows a portion of the projection exposure apparatus, partly in block form. In FIG. 17, exposure light L1 from an exposure optical system (not shown) is applied to a reticle 141 mounted on a reticle stage 142 for projecting an image representing a circuit pattern on the reticle 141 through a projection optical system 143 onto each of shot areas on a wafer 144. X-, Y-, and Z-axes, which will also be referred to as directions X, Y, Z, respectively, are established with respect to the projection exposure apparatus such that the Z-axis extends parallel to the optical axis of the projection optical system 143, the X-axis extends in a plane perpendicular to the Z-axis and parallel to the sheet of FIG. 17, and the Y-axis extends perpendicularly to the sheet of FIG. 17.

The wafer 144 is supported on a Z stage 145 which serves to position the wafer 144 in the direction Z. The Z stage 145 is mounted on an X-Y stage 146 which serves to position the wafer 144 in the directions X, Y. Each of the shot areas on the wafer 144 is positioned on the basis of a wafer mark associated with the shot area.

Figure 18:
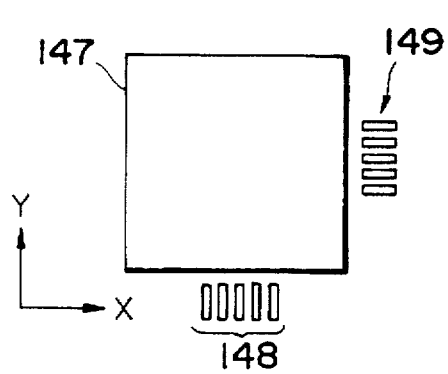
FIG. 18 is an enlarged plan view showing wafer marks associated with a shot area on a wafer in the projection exposure apparatus shown in FIG. 17.

FIG. 18 shows a shot area 147 on the wafer 144. In FIG. 18, a wafer mark 148 along the X-axis which is composed of convex and concave patterns spaced at a given pitch in the direction X is positioned adjacent to the shot area 147, and a wafer mark 149 along the Y-axis which is composed of convex and concave patterns spaced at a given pitch in the direction Y is positioned adjacent to the shot area 147. In this embodiment, the wafer mark 148 along the X-axis is to be detected.

Referring back to FIG. 17, an off-axis imaging alignment system 150 is disposed laterally of the projection optical system 143. The imaging alignment system 150 is also called an FIA (Field Image Alignment) system. In the alignment system 150, illumination light L2 emitted from a position detecting light source 101 such as a halogen lamp or the like is converted by a lens system 102 into a substantially parallel ray of light, which travels to a beam splitter 103. The parallel-ray illumination light L2 that has passed through the beam splitter 103 is converged by a lens system 104 and reaches a half-silvered mirror 105, which reflects the illumination light L2. The reflected illumination light L2 passes through an objective system 106 and irradiates an area containing the wafer mark 148 along the X-axis on the wafer 144. With respect to the illumination light L2, the surface of the wafer 144 is substantially in Fourier-transform relationship to the plane in which the light source 101 lies. The illumination of the wafer mark 148 with the illumination light L2 is substantially Köhler illumination.

The illumination light L2 which is reflected by the wafer 144 is converged by the objective system 106 and travels back to the half-silvered mirror 105. The light that has passed through the half-silvered mirror 105 reaches and passes through a beam splitter 108 to a focusing lens system 109, which forms an image of the wafer mark 148 on an imaging surface of a position detecting imaging device 110 such as a two-dimensional CCD or the like.

Figure 19:
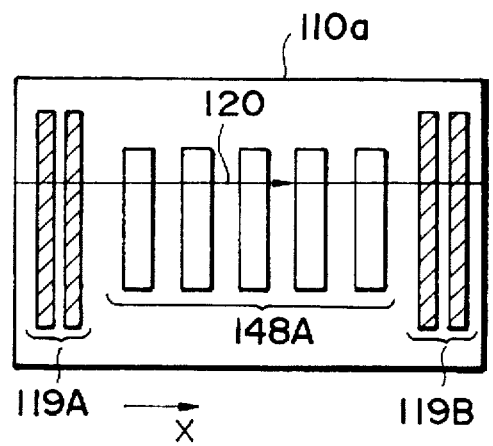
FIG. 19 is an enlarged plan view of an image of a wafer mark on an imaging surface of an imaging device in the projection exposure apparatus shown in FIG. 17.

FIG. 19 shows the imaging surface, denoted at 110a, of the imaging device 110. As shown in FIG. 19, an image 148A of the wafer mark 148 is formed centrally on the imaging surface 110a. Reference marks 119A, 119B are formed one on each side of the wafer mark image 148A in a measuring direction (the direction X) on the imaging surface 110a which corresponds to the measuring direction (the direction X) of the wafer mark 148 on the wafer 144. If pixels of the imaging device 110 are used a reference, then the reference marks 119A, 119B may be dispensed with. The image 148A is converted into an image signal along a scanning line 120 parallel to the direction X on the imaging surface 110a, and the image signal is then processed to detect the position in the direction X of the wafer mark 148 with respect to the reference marks 119A, 119B.

A focus detection system for automatically focusing on the wafer with the off-axis alignment system 150 will be described below. Illumination light L3 emitted from a focus detecting light source (hereinafter referred to as an "AF light source") 111 passes through a condenser lens 112 and irradiates an AF pattern plate 113. The illumination light L3 travels through a rectangular opening pattern defined in the AF pattern plate 113, and reaches the beam splitter 103. The AF light source 111 may comprise a halogen lamp or the like though it may a light-emitting diode, a semiconductor laser, or the like.

The illumination light L3 reflected by the beam splitter 103 passes through the lens system 104 and is reflected by the half-silvered mirror 105. The reflected illumination light L3 passes through the objective system 106, forming an image of the rectangular opening pattern in the AF pattern plate 113, i.e., a projected image 107 of a focusing mark, on the wafer mark 148 on the wafer 144. with respect to the illumination light L3, the plane in which the AF pattern plate 113 lies and the surface of the wafer 144 are substantially in conjugate relationship to each other. The projected image 107 of the focusing mark is used to establish an observation field for detecting the focusing of the wafer mark 148.

The illumination light L3 which is reflected by the wafer 144 passes through the objective system 106 to the half-silvered mirror 105. The light that has passed through the half-silvered mirror 105 reaches the beam splitter 108, which reflects the illumination light L3. The illumination light L3 passes across a pupil limiting plate 114 which covers a half of the beam splitter 108 in a predetermined direction (hereinafter referred to as a "measuring direction S") across the optical axis, and then travels through a focusing lens system 115, forming a pattern image in the projected image 107 of the focusing mark on an imaging surface of a focus detecting imaging device 116 such as a two-dimensional CCD or the like. When the wafer 114 is in a focused position, the surface of the wafer 144 and the imaging surface of the imaging device 116 are in conjugate relationship to each other, and the plane in which the pupil limiting plate 114 lies is in Fourier-transform relationship to the surface of the wafer 144, with respect to the illumination light L3. Since the pupil limiting plate 114 makes the focusing optical system from the wafer 144 to the imaging device 116 no longer telecentric, when the wafer 144 is displaced from the focused position in the direction +Z or −Z, the image of the projected image 107 on the imaging device 116 is shifted laterally in the measuring direction S. In this embodiment, the focused condition of the wafer 144 is detected on the basis of the above process.

The imaging device 116 produces an image signal $V_{AF}$ which is supplied to a signal processor 117. The signal processor 117 integrates the image signal $V_{AF}$ into an integral signal $\Sigma V_{AF}$, and calculates a focusing error (focused extent) of the wafer mark 148 based on the integral signal $\Sigma V_{AF}$. The signal processor 117 outputs the focusing error to a stage control system 118. The stage control system 118 actuates the Z stage 118 in the direction Z by a distance corresponding to the focusing error. In this manner, the wafer mark 148 is brought into focus based on the automatic focusing process.

A process of detecting the focused condition of the wafer 144 in the second embodiment will be described below with reference to FIGS. 20 through 24.

Figure 20:
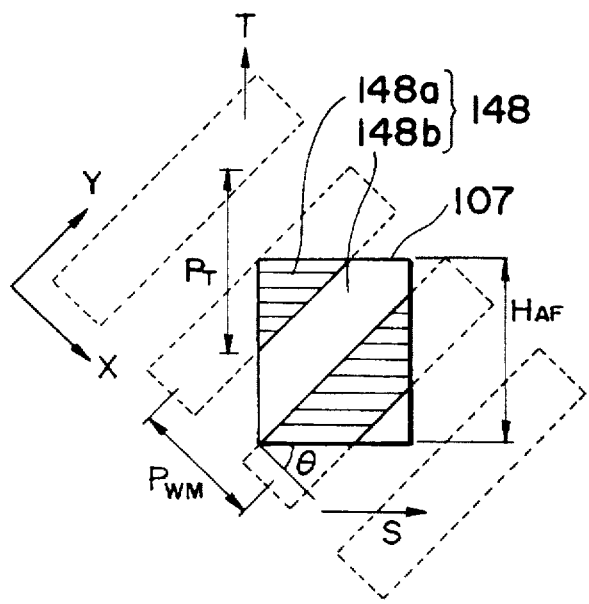
FIGS. 20 through 22 are diagrams showing the manner in which a focused position is detected.

FIG. 20 shows the wafer mark 148 at an enlarged scale. In FIG. 20, the projected image 107 of the focusing mark is formed on the wafer mark 148. A direction in FIG. 20 which corresponds to the measuring direction S defined by the pupil limiting plate 114 shown in FIG. 17 is also referred to as a measuring direction S, and a direction perpendicular to the measuring direction S is referred to as a non-measuring direction T. The projected image 107 is of a rectangular shape having parallel sides in each of the measuring direction S and the non-measuring direction T. The measuring direction S crosses the direction X, which is the measuring direction of the wafer mark 148, at a counterclockwise angle θ which may be about 45°, for example. The wafer mark 148 is composed of a periodic array of convex strips 148a and concave strips 148b which extend in the direction Y and are spaced at a pitch $P_{WM}$ in the direction X. The convex strips 148a have a smaller reflectance, for example, and the concave strips 148b have a larger reflectance, for example.

The convex and concave strips 148a, 148b of the wafer marks 148 are spaced in the non-measuring direction T at a pitch $P_T$ of $P_{WM}/\sin\theta$. The projected image 107 of the focusing mark has a width $H_{AF}$ in the non-measuring direction T which is set to an integral multiple of the pitch $P_T$ in the non-measuring direction T. Therefore, the width $H_{AF}$ is expressed according to the following equation (1):

$$H_{AF}=n \cdot P_T \quad (1)$$

where n is an integer of at least 1. In FIG. 20, the width $H_{AF}$ is equal to the pitch $P_T$ (n=1).

The width of the projected image 107 of the focusing mark in the measuring direction S is arbitrary. The projected image 107 may be divided in the measuring direction S into a pattern of multiple segments.

Figure 21:
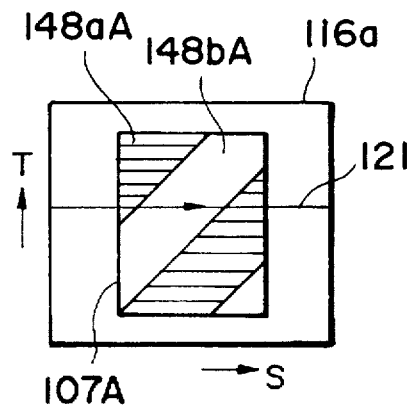

FIG. 21 shows an image corresponding to the wafer mark 148 and the projected image 107 shown in FIG. 20, as observed on the focus detecting imaging device 116 shown in FIG. 17. In FIG. 21, an image 107A of the projected image 107 is formed centrally on an imaging surface 116a of the imaging device 116, and one periodic pattern in the non-measuring direction T of dark strip images 148aA corresponding to convex strips 148a of the wafer mark 148 and bright strip images 148bA corresponding to concave strips 148b of the wafer mark 148 is formed in the image 107A. The imaging device 116 scans these images on the imaging surface 116a along a scanning line 121 parallel to the measuring direction X, and successively photoelectrically converts the images into an image signal $V_{AF}$, which is outputted to the signal processor 117. The signal processor 117 integrates (adds) the image signal $V_{AF}$ in the non-measuring direction T, thereby producing an integral signal $\Sigma V_{AF}$ which is represented by a substantially rectangular curve 122A indicated by the solid line in FIG. 22.

While the wafer mark 148 lies in a plane that is conjugate relationship to the imaging surface of the position detecting imaging device 110 with respect to the illumination light L2, i.e., the wafer mark 148 is in focus with the objective system 106, with respect to the illumination light L2, a barycenter S1 of the integral signal $\Sigma V_{AF}$ in the measuring direction S has been determined and stored as a reference position. The reference position S1 can be determined using a pixel at an end of the imaging device 116 as a reference, for example. For subsequently focusing the wafer 114, when the position (focused position) of the wafer mark 148 in the direction Z is vertically shifted out of focus with the objective system 106 with respect to the illumination light L2, the image 107A of the projected image 107 of the focusing mark on the imaging device 116 is shifted in one direction or the other along the measuring direction S because the focusing optical system is not telecentric. As a result, the produced integral signal $\Sigma V_{AF}$ is shifted in one direction or the other along the measuring direction S as indicated by dot-and-dash-line curves 122B, 112C in FIG. 22. Consequently, the wafer 144 can be brought into the focused position when the Z stage 145 is actuated so that the barycenter S1 of the integral signal $\Sigma V_{AF}$ reaches the reference position.

Figure 23:
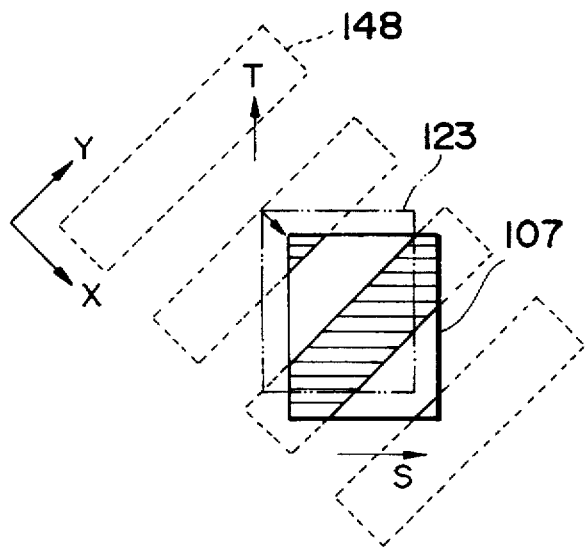
FIGS. 23 and 24 are diagrams showing the manner in which a wafer mark is shifted off position.
Figure 24:
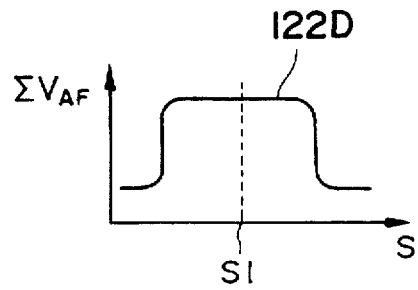

The accuracy of prealignment at this time is not so high that the position of the wafer 148 may be shifted in the direction −X in FIG. 17. When such a positional shift occurs, as shown in FIG. 23, the projected image 107 of the focusing mark on the wafer mark 148 is shifted in the direction +X from a position 128 which corresponding to the position of the projected image 107 in FIG. 20. However, since the width of the projected image 107 in the non-measuring direction T is an integral multiple of the pitch $P_T$ of the wafer mark 148 in the non-measuring direction T, the barycenter of the integral signal $\Sigma V_{AF}$ which is produced by integrating the image signal is not shifted off the reference position S1 as indicated by the curve 122D in FIG. 24. Therefore, the wafer 144 can be focused highly accurately without being affected by the pattern and reflectance of the wafer mark 148.

In FIG. 20, the convex and concave strips 148a, 148b of the wafer mark 148 have different reflectances. However, the wafer 144 can be focused highly accurately using a wafer mark whose convex and concave strips 148a, 148b have the same reflectance. In addition, the wafer 144 can be focused highly accurately if a wafer mark to be detected is free of convex and concave strips, but has only different reflectances.

The configuration, e.g., the pitch in the measuring direction, of the wafer marks associated with the shot areas on the wafer 144 may vary from process to process. In FIG. 17, a plurality of AF pattern plates 113 having respective opening patterns which satisfy the equation (1) above with respect to respective wafer marks to be detected may be made available, and one of the AF pattern plates 113 which matches a wafer mark to be detected may be mechanically selected.

The AF pattern plate 113 may not be fixed, but may be composed of a plurality of movable blades actuatable by a mechanical drive mechanism, and the movable blades may be extended or contracted in order to satisfy the equation (1) above with respect to a wafer mark to be detected.

Alternatively, the AF pattern plate 113 may comprise a device whose light-transmitting area can electrically be varied in shape, such as a liquid-crystal panel. After the shape of a mark to be measured is recognized, the shape of the light-transmitting area of the AF pattern plate 113, i.e., the shape of an observation field on the mark, may be selected so as to satisfy the equation (1).

Instead of defining the observation field with the projected image 107 of the focusing mark on the wafer mark 148, an image reading area on the imaging surface 116a (see FIG. 21) of the focus detecting imaging device 116 may be limited according to the equation (1). To accomplish such a modification, the signal processor 117 may include a frame memory, and after the image signal $V_{AF}$ from the imaging device 116 is stored in the frame memory, an image signal at addresses corresponding to the image reading area established to satisfy the equation (1) may be read from the frame memory. If a mark to be detected is known in advance, then the image reading area may be fixed. Alternatively, after the shape of a mark to be detected is recognized, the image reading area may be limited arbitrarily.

[3rd Embodiment]

According to a third embodiment of the present invention, the AF pattern plate 113 according to the second embodiment shown in FIG. 17 is replaced with two other members for increasing the intensity of a focus detecting signal.

Figure 25:
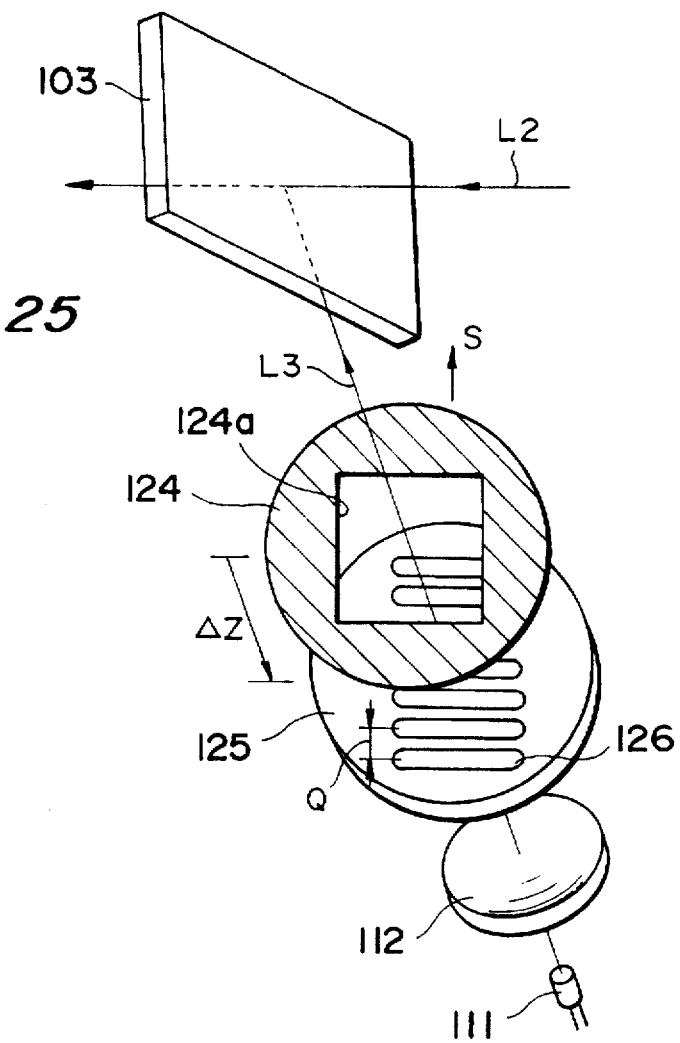
FIG. 25 is a perspective view of a portion of a projection exposure apparatus which incorporates an alignment system according to a third embodiment of the present invention.

FIG. 25 shows a portion of a projection exposure apparatus which incorporates an alignment system according to the third embodiment of the present invention. As shown in FIG. 25, an AF pattern plate 125 which comprises a light-transmissive plate and an AF field stop 124 are disposed between the condenser lens 112 and the beam splitter 103.

The AF field stop 124 is positioned in a plane which is substantially conjugate relationship to the surface of the wafer 144 (see FIG. 17) with respect to the focus detecting illumination light L3, and the AF pattern plate 125 is located in a position that is defocused from the AF field stop 124 along the optical axis by a distance ΔZ.

The AF field stop 124 has an opening 124a defined therein which has the same shape as the opening pattern in the AF pattern plate 113 shown in FIG. 17. The AF pattern plate 125 has a phase grating 126 of convex and concave strips spaced at a given pitch Q in the measuring direction S. Other structural details of the alignment system are identical to those shown in FIG. 17 and will not be described in detail below.

In the third embodiment, the distance ΔZ by which the AF pattern plate 125 as a phase object is defocused is set to different quantities depending on the shape of a wafer mark to be detected and the illuminating condition. However, it is necessary that the defocused distance ΔZ be greater than the depth of focus $\delta_{AF}$ of a relay lens system composed of the lens system 104 and the objective system 106, on at least the AF field stop 124.

Figure 26:
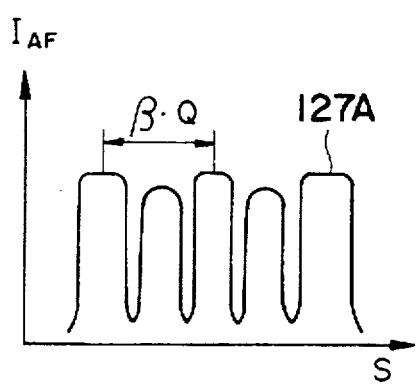
FIGS. 26 and 27 are diagrams showing distributions of light intensities on a wafer in the projection exposure apparatus shown in FIG. 25.

FIG. 26 shows an intensity distribution curve 127A representative of a distribution of light intensities $I_{AF}$ of a projected image of the opening 124a in the AF field stop 124 on the wafer mark 148 when the defocused distance ΔZ is nil. The horizontal axis of the graph shown in FIG. 26 indicates the focus detecting measuring direction S on the wafer 144 which corresponds to the measuring direction S in FIG. 20. If the magnification of an image projected onto the wafer 144 by the relay lens system composed of the lens system 104 and the objective system 106 is represented by β, then the intensity distribution curve 127A has a pitch β·Q in the measuring direction S. The intensity distribution represented by the intensity distribution curve 127A is substantially the same as the intensity distribution produced by the alignment system according to the second embodiment shown in FIG. 17 except that the intensity distribution curve 127A has sharp drops or valleys at every interval of β·Q/2.

Figure 27:
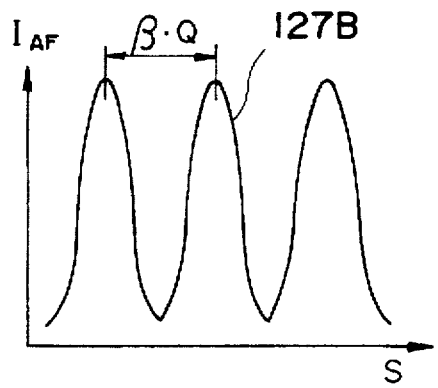

If the absolute value of the defocused distance ΔZ is greater than at least the depth of focus $\delta_{AF}$ of the relay lens system, then the light intensity $I_{AF}$ of the projected image of the opening 124a in the AF field stop 124 on the wafer mark 148 varies in the pattern of a sine wave at the pitch β·Q in the measuring direction S as indicated by an intensity distribution curve 127B shown in FIG. 27. Therefore, when the projected image is imaged by the imaging device 116, the S/N ratio of an image signal produced by the imaging device 116 is partly increased. Whereas the maximum level of the produced image signal $V_{AF}$ is embedded in the noise level with the waveform shown in FIG. 26, the level of the image signal $V_{AF}$ is partly higher than the noise level with the waveform shown in FIG. 27, allowing focus detection. The image signal $V_{AF}$ may be processed, for example, by regarding the waveform shown in FIG. 27 as multiple marks, and setting the average of the positions of peaks of an integrated value in the non-measuring direction of the image signal $V_{AF}$ corresponding to the waveform shown in FIG. 27, to a predetermined reference position. With this arrangement, the S/N ratio for focus detection is increased.

[4th Embodiment]

According to a fourth embodiment of the present invention, dichroic mirrors 129, 130 (see FIG. 28) are used in place of the beam splitters 103, 108 shown in FIG. 17 for preventing the intensity of illumination light from being lowered and also preventing the illumination light L2 and the illumination light L3 from overlapping each other.

Figure 28:
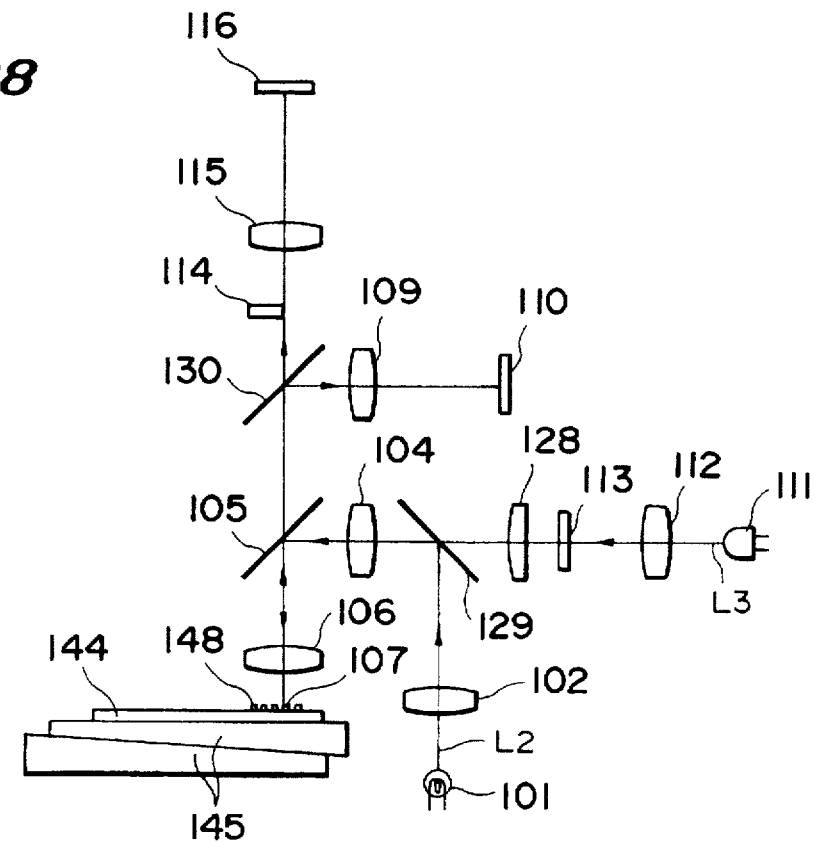
FIG. 28 is a side elevational view of an alignment system according to a fourth embodiment of the present invention.

FIG. 28 shows an alignment system according to the fourth embodiment of the present invention. Those parts shown in FIG. 28 which are identical to those shown in FIG. 17 are denoted by identical reference numerals. As shown in FIG. 28, illumination light L2 emitted from a position detecting light source 101 passes through a lens system 102 and is reflected by a dichroic mirror 129 to a lens system 104. Illumination light L3 emitted from a focus detecting AF light source 111 is converged onto an AF pattern plate 113 by a condenser lens 112. The illumination light L3 then passes through an opening pattern in the AF pattern plate 113, a cylindrical lens 128, and a dichroic mirror 129 to the lens system 104. The illumination light L2 and the illumination light L3 which have passed through the lens system 104 are reflected together by a half-silvered mirror 105 and travel together through an objective system 106 to a wafer mark 148 on a wafer 144. The illumination light L3 forms a projected image 107 of a focusing mark on the wafer 148.

The illumination light L2 and the illumination light L3 which have been reflected by the wafer mark 148 pass through the objective system 106 and the half-silvered mirror 105 to a dichroic mirror 130. The illumination light L2 is reflected by the dichroic mirror 130 travels through a focusing lens system 109, forming an image of the wafer mark 148 on an imaging device 110. The illumination light L3 which has passed through the dichroic mirror 130 travels across a pupil limiting plate 114 and through a focusing lens system 115, forming an image of the projected image 107 of the focusing mark on the imaging device 116. The dichroic mirrors 129, 130 have such wavelength selectivity that they reflect the position detecting illumination light L2 and transmit the focus detecting illumination light L3. Other structural details of the alignment system shown in FIG. 28 are identical to those of the alignment system shown in FIG. 17.

In the fourth embodiment, the wafer 107 is focused in the same manner as with the second embodiment based on the image signal produced by the imaging device 116. Only the illumination light L2 is applied to the imaging device 110, and only the illumination light L3 is applied to the imaging device 116. Therefore, the process of detecting the position of the wafer 144 and the process of detecting the focused position of the wafer 144 are carried out with a high S/N ratio. Since the dichroic mirrors 129, 130 do not cause any intensity loss of the illumination light L2, L3, the illumination efficiency is about four times the illumination efficiency of the alignment system according to the second embodiment.

In the fourth embodiment shown in FIG. 28, the focus detecting illumination light L3 passes through the dichroic mirror 129, and the AF pattern plate 113 for limiting a focusing observation field is positioned on the light source side of the dichroic mirror 129. Therefore, the projected image 107 of the focusing mark on the wafer 144 would be largely blurred due to astigmatism, failing to satisfy the equation (1). According to the fourth embodiment, the cylindrical lens 128 for canceling out astigmatism caused by the dichroic mirror 129 is positioned in the focusing illumination system for making the projected image 107 clear enough to satisfy the equation (1).

[5th Embodiment]

According to a fifth embodiment, a common light source such as a halogen lamp or the like is used as both a position detecting (alignment) light source and a focus detecting light source.

Figure 29:
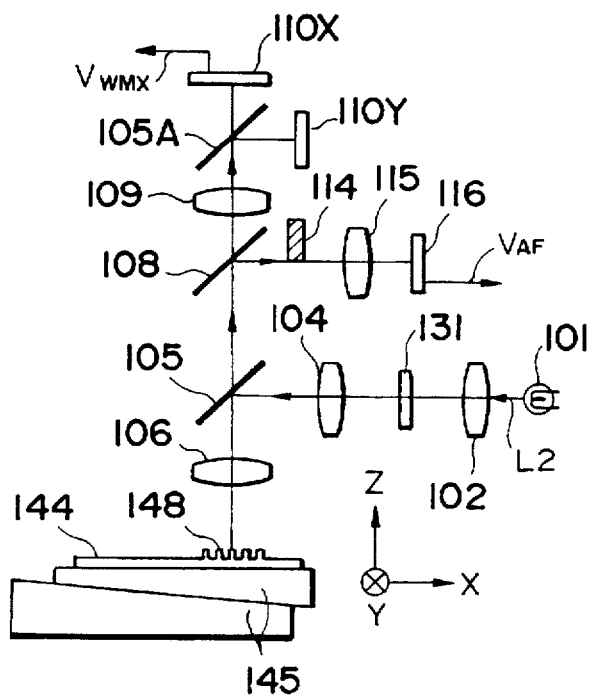
FIG. 29 is a side elevational view of an alignment system according to a fifth embodiment of the present invention.
Figure 30:
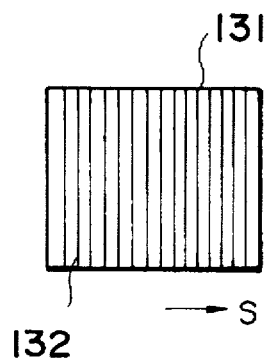
FIG. 30 is an enlarged plan view of an AF pattern plate in the alignment system shown in FIG. 29.

FIG. 29 shows an alignment system according to the fifth embodiment of the present invention. Those parts shown in FIG. 29 which are identical to those shown in FIG. 17 are denoted by identical reference numerals. As shown in FIG. 29, illumination light L2 emitted from a light source 101 which comprises a halogen lamp passes through a collimator lens 102 and irradiates an AF pattern plate 131. The AF pattern plate 131 has a striped pattern 132 (see FIG. 30) composed of dark and bright strips spaced at a given pitch in the measuring direction S, with such a duty cycle that the dark strips are narrower than the bright strips. The illumination light L2 that has passed through the AF pattern plate 131 travels through a lens system 104, is reflected by a half-silvered mirror 105, and passes through an objective system 106 to a wafer mark 148 on a wafer 144, forming an image of the striped pattern 132, i.e., a projected image 132A (see FIG. 31) of a focusing mark, on the wafer mark 148.

The illumination light L2 reflected by the wafer 144 passes through the objective system 106 and is reflected by a beam splitter 108. The illumination light L2 reflected by the beam splitter 108 travels across a pupil limiting plate 114 and through a focusing lens system 115 to an imaging surface of an imaging device 116, forming an image of the projected image 132A of the focusing mark on the imaging surface of the imaging device 116. The light that has passed through the beam splitter 108 travels through a focusing lens 109 and is divided by a half-silvered mirror 105A into two light rays which form images of the wafer mark respectively on imaging devices 110X, 110Y along the respective X- and Y-axes. Each of the images formed on the imaging devices 110X, 110Y is an overlapping combination of the image of the wafer mark 148 and the projected image 132A of the focusing mark.

Figure 31:
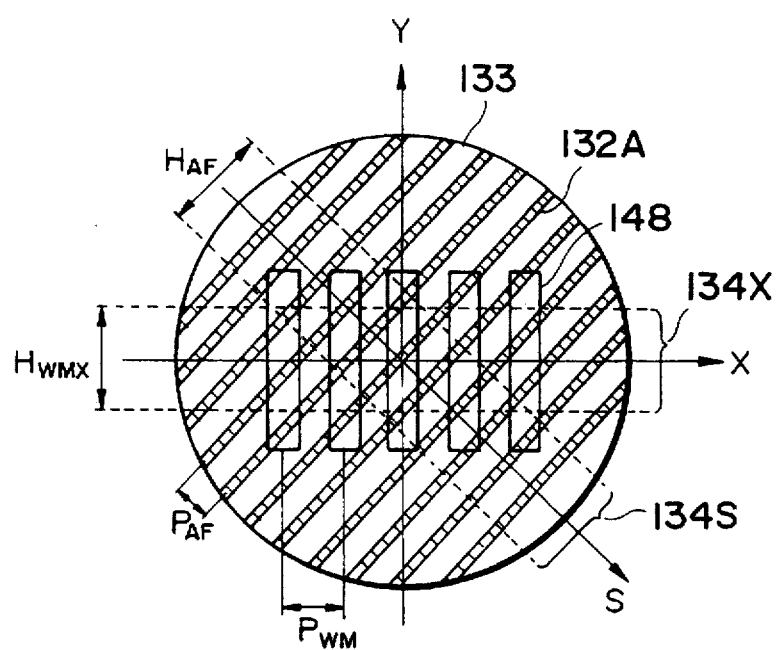
FIG. 31 is an enlarged plan view of a projected image of a focusing mark on a wafer mark in the alignment system shown in FIG. 29.

FIG. 31 shows an illuminated field 133 over the wafer mark 148. As shown in FIG. 31, the wafer mark 148 is composed of a pattern of convex and concave strips spaced at a pitch $P_{WM}$ in the direction X. The projected image 132A of the focusing mark comprises a pattern of dark and bright strips spaced at a pitch $P_{AF}$ in the measuring direction S which crosses the direction X at a clockwise angle of 45°. The imaging device 110X has a detecting area thereon which is in conjugate relationship with a detecting area 134X (see FIG. 31) which has a width $H_{WMX}$ in the direction Y in FIG. 31. The imaging device 110Y has a detecting area thereon which is in conjugate relationship with a detecting area 134X which has a width $H_{AF}$ in the non-measuring direction perpendicular to the measuring direction S in FIG. 31. The widths $H_{WMX}$, $H_{AF}$ are selected with respect to the pitches $P_{WM}$, $P_{AF}$ to satisfy the following equations (2), (3):

$$H_{AF}=n \cdot P_{WM} \cdot 2^{1/2} \qquad (2)$$

$$H_{WMX}=n' \cdot P_{AF} \cdot 2^{1/2} \qquad (3)$$

where n, n' are integers of at least 1.

Stated otherwise, these equations (2), (3) signify that the width $H_{WMX}$ in the non-measuring direction (the direction Y), of the detecting area 134X for positional detection (alignment) is set to an integral multiple of the pitch of the projected image 132A of the focusing mark in the direction Y, and the width $H_{AF}$ in the non-measuring direction of the detecting area 134S for focus detection is set to an integral multiple of the pitch of the wafer mark 148 in the non-measuring direction. Therefore, the condition of the equation (2) is the same as the condition of the equation (1).

Figure 32:
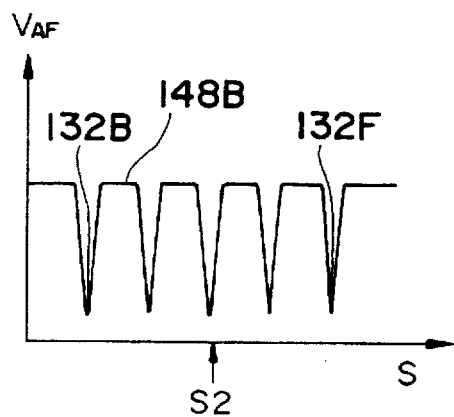
FIG. 32 is a diagram showing the waveform of an image signal $V_{AF}$ for focus detection in the alignment system shown in FIG. 29.

As shown in FIG. 32, an image signal $V_{AF}$ outputted from the imaging device 116 has level drops or valleys 132B~132F spaced at a given pitch in the measuring direction S, with flat levels 148B between those level drops or valleys 132B~132F. Actually, signal levels corresponding to the boundaries between the convex and concave strips of the wafer mark 148 are also reduced. Since the equation (2) is essentially satisfied, such signal level reductions are canceled out by integrating the image signal $V_{AF}$ in the non-measuring direction. Therefore, even if the wafer mark 148 is shifted laterally with respect to the projected image 132A of the focusing mark in FIG. 31, the produced image signal $V_{AF}$ maintains its waveform shown in FIG. 32. The waveform shown in FIG. 32 is regarded as an image of multiple patterns, and the positions of the level drops or valleys 132B~132F in the measuring direction S are averaged. A focus error can then be determined by determining a deviation of the averaged value from a reference position S2 that has been determined in advance in the focused condition.

Figure 33:
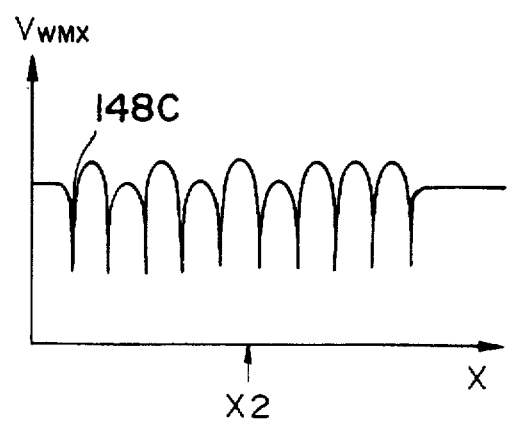
FIG. 33 is a diagram showing the waveform of an image signal $V_{wmx}$ for position detection in the alignment system shown in FIG. 29.

As shown in FIG. 33, an image signal $V_{WMX}$ outputted from the position detecting imaging device 110X has level drops or valleys 148C spaced at a given pitch in the direction X which is the measuring direction. These level drops or valleys 132B~132F correspond to the boundaries between the convex and concave strips of the wafer mark 148. Actually, signal levels corresponding to the dark strips of the projected image 132A of the focusing mark are also reduced. Since the equation (3) is essentially satisfied, such signal level reductions are canceled out by integrating the image signal $V_{WMX}$ in the non-measuring direction corresponding to the direction Y. Therefore, even if the projected image 132A of the focusing mark and the wafer mark 148 are shifted laterally in FIG. 31, the produced image signal $V_{AF}$ maintains its waveform shown in FIG. 33. The positions of the level drops or valleys 148C of the image signal $V_{WMX}$ shown in FIG. 33 in the direction X are averaged, and a positional shift in the direction S of the wafer mark 148 can then be determined by determining a deviation of the averaged value from a reference position X2 corresponding to the optical axis of the objective system 106.

In this embodiment, as shown in FIG. 31, the duty cycle of the projected image 132A of the focusing mark is selected such that the dark strips are narrower than the bright strips, the intensity of illumination light applied to the wafer mark 148 is high, increasing the level of the position detecting image signal $V_{WMX}$. Because of such a duty cycle, even if the width $H_{WMX}$ in the direction Y of the position detecting area 134X somewhat deviates from the equation (3), its effect on the apparatus illuminance distribution that is obtained as the image signal $V_{WMX}$ as shown in FIG. 33 is small.

Inasmuch as the light source 101 comprises a halogen lamp which has a wider wavelength band than a light-emitting diode, the automatic focusing image signal $V_{AF}$ is less susceptible to a thin-film interference caused by the photoresist coated on the wafer 144, thus preventing erroneous focus detection. Because no dedicated illumination system for focus detection is required, the entire optical system is simplified, and the cost of manufacturing the alignment system is lowered. The position of the wafer mark 149 along the Y-axis shown in FIG. 18 can be detected by processing the image signal from the imaging device 110Y. Automatic focusing at this time is carried out based on the image signal $V_{AF}$ from the imaging device 116 as with the automatic focusing for the X-axis.

[6th Embodiment]

Figure 34:
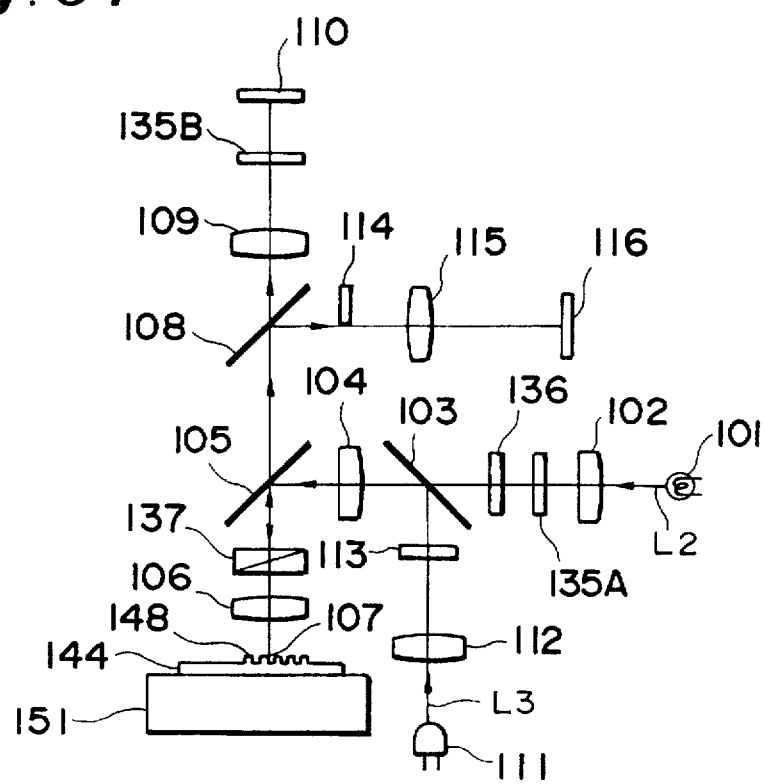
FIG. 34 is a side elevational view of an alignment system according to a sixth embodiment of the present invention, which is incorporated in a differential interference microscope.

According to a sixth embodiment, the present invention is applied to a mechanism for effecting an automatic focusing process when a periodic mark is observed by a differential interference microscope. FIG. 34 shows an alignment system according to the sixth embodiment of the present invention, which is incorporated in a differential interference microscope. Those parts shown in FIG. 34 which are identical to those shown in FIG. 17 are denoted by identical reference numerals.

As shown in FIG. 34, illumination light L2 from a position detecting light source 101 passes through a collimator lens 102, a polarizer 135A, and a phase plate 136 to a beam splitter 103. Illumination light L3 emitted from a focus detecting AF light source 111 passes through a condenser lens 112 and an AF pattern plate 113, and is then combined with the illumination light L2 by the beam splitter 103. The combined light travels through a lens system 104, is reflected by a half-silvered mirror 105, and passes through a double-image prism 137 and an objective system 106 to irradiate a wafer mark 148 on a wafer 144, forming a projected image 107 of a focusing mark on the wafer mark 148. The wafer 144 is placed on a specimen support 151 which positions the wafer 144 in the direction of the optical axis of the objective system 106. Reflected light from the wafer 144 travels back through the objective system 106, the double-image prism 137, and the half-silvered mirror 105 to a beam splitter 108. The light that has passed through the beam splitter 108 travels through a focusing lens system 109 and an analyzer 155B, forming an image of the wafer mark 148 on an imaging device 110. Other structural details of the alignment system shown in FIG. 34 are the same as those shown in FIG. 17.

Figure 22:
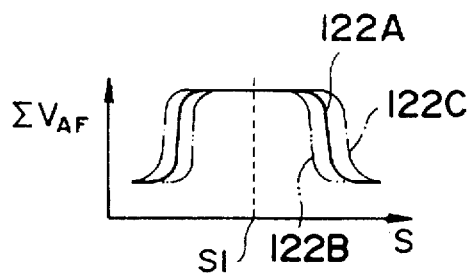

In this embodiment, the width of the projected image 107 of the focusing mark in the non-measuring direction T is an integral multiple of the pitch of the wafer mark 148 in the non-measuring direction T, as with FIG. 20. With this arrangement, the integral signal produced by integrating the image signal from the focus detecting imaging device 116 has a stable waveform as shown in FIG. 22 regardless of the direction of polarized separation by the double-image prism 137, the orientation of the polarizer 135A or the analyzer 135B, of the phase difference caused by the phase plate 136. Such a stable waveform can also be achieved by an optical system which does not employ the phase plate 136 and the analyzer 135B or an optical system in which the double-image prism 137 is placed in only the detection optical system (between the beam splitter and the imaging device 110).

While the position of the mark to be detected is detected by the Field Image Alignment (FIA) method in this embodiment, the principles of the present invention are also applicable for stable automatic focusing to an alignment system of the so-called heterodyne interference type in which coherent laser beams are applied to the mark to be detected from two directions, and the position of the mark is detected on the basis of the phase of a heterodyne beam that returns from the mark.

[7th Embodiment]

Figure 35:
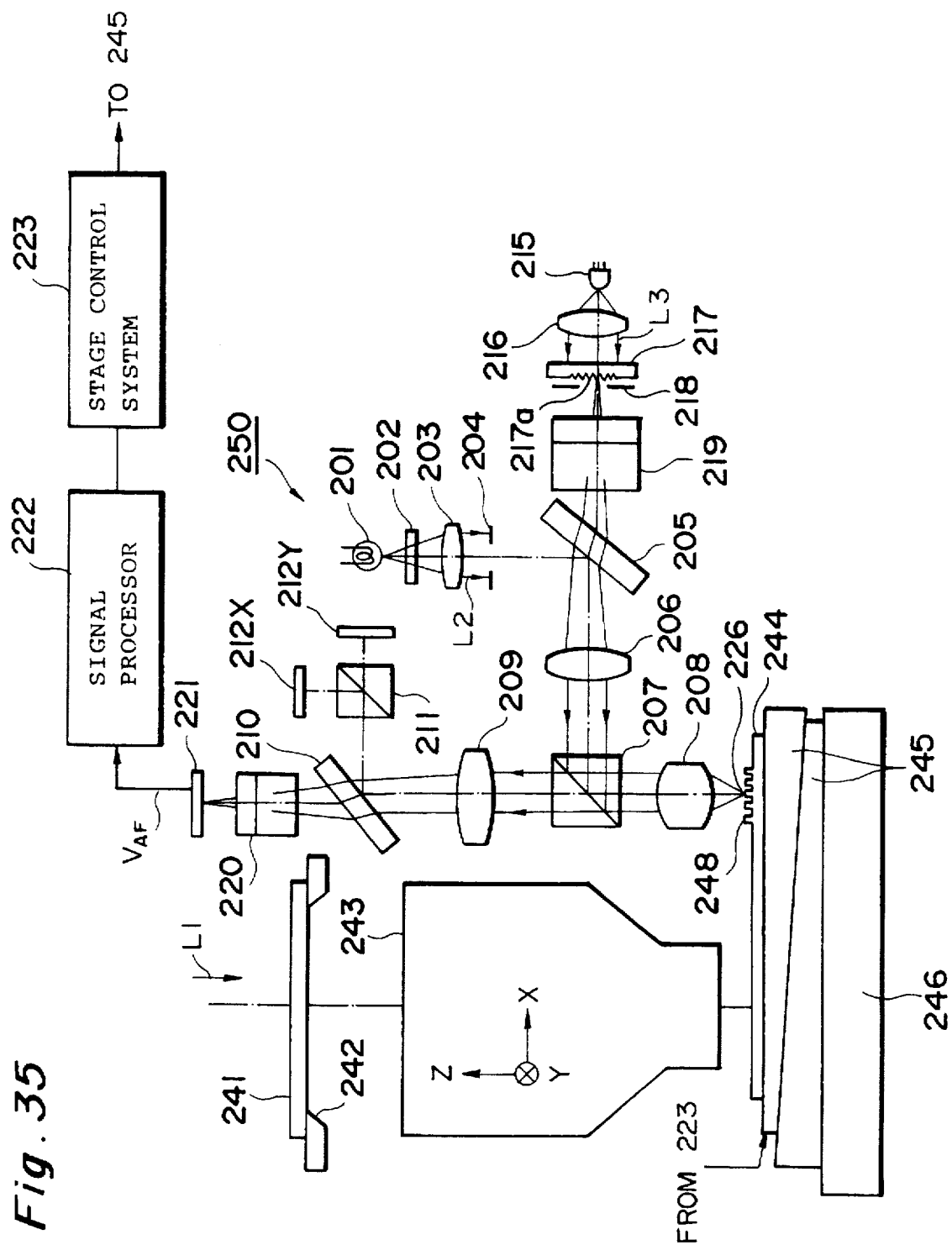
FIG. 35 is a side elevational view, partly in block form, of a projection exposure apparatus which incorporates an alignment system according to a seventh embodiment of the present invention.

A seventh embodiment of the present invention will be described below with reference to FIGS. 35 through 43. The alignment system according to the seventh embodiment comprises an off-axis alignment system which is incorporated in a projection exposure apparatus for fabricating semiconductor devices. FIG. 35 shows a portion of the projection exposure apparatus, partly in block form. In FIG. 35, exposure light L1 from an exposure optical system (not shown) is applied to a reticle 241 mounted on a reticle stage 242 for projecting an image representing a circuit pattern on the reticle 241 through a projection optical system 243 onto each of shot areas on a wafer 244. X-, Y-, and Z-axes, which will also be referred to as directions X, Y, Z, respectively, are established with respect to the projection exposure apparatus such that the Z-axis extends parallel to the optical axis of the projection optical system 243, the X-axis extends in a plane perpendicular to the Z-axis and parallel to the sheet of FIG. 35, and the Y-axis extends perpendicularly to the sheet of FIG. 35.

The wafer 244 is supported on a Z stage 245 which serves to position the wafer 244 in the direction Z. The Z stage 245 is mounted on an X-Y stage 246 which serves to position the wafer 244 in the directions X, Y. Each of the shot areas on the wafer 244 is positioned on the basis of a wafer mark associated with the shot area.

Figure 36:
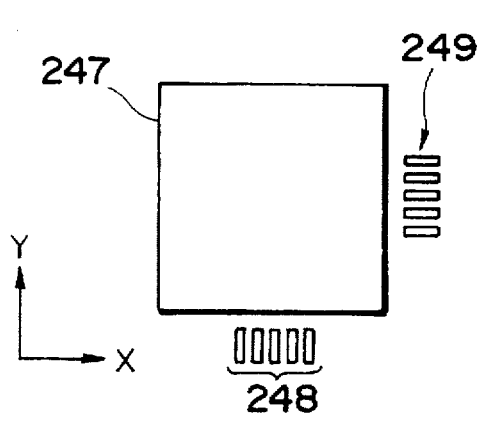
FIG. 36 is an enlarged plan view showing wafer marks associated with a shot area on a wafer in the projection exposure apparatus shown in FIG. 35.

FIG. 36 shows a shot area 247 on the wafer 244. In FIG. 36, a wafer mark 248 along the X-axis which is composed of convex and concave patterns spaced at a given pitch in the direction X is positioned adjacent to the shot area 247, and a wafer mark 249 along the Y-axis which is composed of convex and concave patterns spaced at a given pitch in the direction Y is positioned adjacent to the shot area 247. In this embodiment, the wafer mark 248 along the X-axis is to be detected.

Referring back to FIG. 35, an off-axis imaging alignment system 250 is disposed laterally of the projection optical system 243. The imaging alignment system 250 is also called an FIA (Field Image Alignment) system. In the alignment system 250, illumination light emitted from a position detecting light source 201 such as a halogen lamp or the like is applied to an optical bandpass filter 202 which selects illumination light L2 in a visible range that will not sensitize the photoresist on the wafer 244. The illumination light L2 is converged onto a field stop 204 by a condenser lens 203. The illumination light L2 that has passed through the field stop 204 is substantially fully reflected by a dichroic mirror 205, and converted into a substantially parallel ray by an illumination relay lens 206 and then reaches a half-silvered prism 207, which reflects the illumination light L2. The reflected illumination light L2 passes through a first objective 208 and irradiates an observation area containing the wafer mark 248 along the X-axis on the wafer 244.

With respect to the illumination light L2, the plane in which the field stop 204 lies and the surface of the wafer 244 are substantially in conjugate relationship to each other. The illumination of the wafer mark 248 with the illumination light L2 is substantially Köhler illumination.

The illumination light L2 which is reflected by the wafer 244 is converged by the first objective 208 and travels back to the half-silvered prism 207. The light that has passed through the half-silvered prism 207 travels through a second objective 209 to a dichroic mirror 210. The illumination light L2 is substantially fully reflected by the dichroic mirror 210, and then divided by a half-silvered prism 211 into two light rays which are applied respectively to imaging surfaces of imaging devices 212X, 212Y along the respective X- and Y-axes, each comprising a two-dimensional CCD or the like. When the wafer 244 is in focus, the imaging surfaces of imaging devices 212X, 212Y are in conjugate relationship to the surface of the wafer 244, forming an image of the wafer 248 on the imaging surface of the imaging device 212X along the X-axis.

Figure 37:
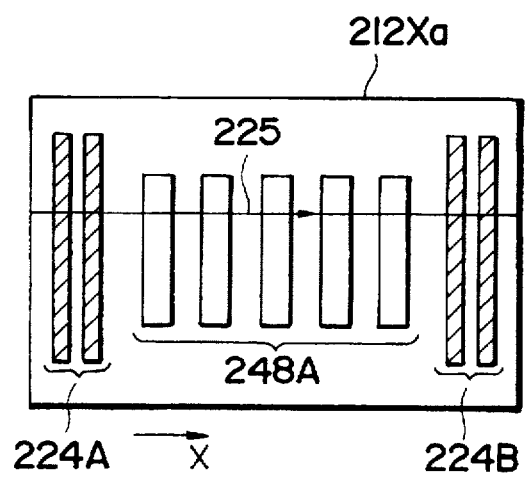
FIG. 37 is an enlarged plan view of an image of a wafer mark on an imaging surface of an imaging device in the projection exposure apparatus shown in FIG. 35.

FIG. 37 shows the imaging surface, denoted at 212Xa, of the imaging device 212X. As shown in FIG. 37, an image 248A of the wafer mark 248 is formed centrally on the imaging surface 212Xa. Reference marks 224A, 224B are formed one on each side of the wafer mark image 248A in a measuring direction (the direction X) on the imaging surface 212Xa which corresponds to the measuring direction (the direction X) of the wafer mark 248 on the wafer 244. If pixels of the imaging device 212X are used a reference, then the reference marks 224A, 224B may be dispensed with. The image 248A is converted into an image signal along a scanning line 225 parallel to the direction X on the imaging surface 212Xa, and the image signal is then processed to detect the position in the direction X of the wafer mark 248 with respect to the reference marks 224A, 224B. On the other hand, position in the direction Y of the wafer mark 249 along the Y-axis shown in FIG. 36 is detected by processing the image signal of the imaging device 212Y for the direction Y shown in FIG. 35.

A focus detection system for automatically focusing on the wafer with the off-axis alignment system 250 will be described below. Illumination light (AF detection light) L3 emitted from a focus detecting light source (hereinafter referred to as an "AF light source") 215 which comprises a light-emitting diode passes through a condenser lens 216 and irradiates an AF phase pattern plate 217. The illumination light L3 has a wavelength band different from the wavelength band of the position detecting illumination light L2, and the dichroic mirrors 205, 210 have such wavelength selectivity that they reflect the illumination light L2 and transmit the illumination light L3. The AF phase pattern plate 217 comprises a phase pattern 217a composed of convex and concave strips disposed on a transmissive substrate such as a glass substrate or the like and spaced at a given pitch in the measuring direction. The difference between the lengths of optical paths of adjacent convex and concave strips of the phase pattern 217a is set to ¼ (90° in phase) of the central wavelength $\lambda_0$ of the illumination light L3.

The illumination light L3 that has passed through the phase pattern 217a of the AF phase pattern plate 217 travels through a field stop 218 and then a plane-parallel plate 219 which is inclined at an angle of 45° to the optical axis, and then reaches the dichroic mirror 205 which is angularly displaced 90° from the plane-parallel plate 219. The plane-parallel plate 219 and the dichroic mirror 205 jointly make up a first coma imparting optical system for correcting astigmatism and generating coma with respect to an image of the phase pattern 217a.

The illumination light L3 that has passed through the dichroic mirror 205 passes through the illumination relay lens 206 and is applied as a substantially parallel ray to the half-silvered prism 207. The reflected illumination light L3 from the half-silvered prism 207 passes through the first objective 208, forming an image of the phase pattern 217a of the AF phase pattern plate 217, i.e., a projected image 226 of a focusing mark, on the wafer mark 248 on the wafer 244. With respect to the illumination light L3, the plane in which the AF phase pattern plate 217 lies and the surface of the wafer 244 are substantially in conjugate relationship to each other. Since the field stop 218 is positioned near the AF phase pattern plate 217, the field stop 218 defines a region for the projected image 226 of the focusing mark which is projected onto the wafer 244, i.e., an observation region for focus detection. The image of the phase pattern 217a contains dark strips corresponding to the steps of the phase pattern 217a, and the projected image 226 of the focusing mark, therefore, comprises a one-dimensional grating pattern composed of dark and bright strips, the dark strips being narrower than the bright strips.

The illumination light L3 which is reflected from the projected image 226 of the focusing mark passes through the first objective 208 to the half-silvered prism 207. The light that has passed through the half-silvered prism 207 travels through the second objective 209 and reaches the dichroic mirror 210 which crosses the optical axis at 45°. The illumination light L3 passes substantially fully through the dichroic mirror 210, and then travels through a plane-parallel plate 220 which is angularly displaced 90° from the dichroic mirror 210 to a focus detecting imaging device 221, forming an image of the projected image 226 of the focusing mark on an imaging surface of the imaging device 221 which comprises a two-dimensional CCD or the like. When the wafer 244 is in a focused position, the surface of the wafer 244 and the imaging surface of the imaging device 221 are in conjugate relationship to each other with respect to the illumination light L3.

The dichroic mirror 210 and the plane-parallel plate 210 jointly make up a second coma imparting optical system for correcting astigmatism and generating coma with respect to the projected image 226 of the focusing mark. In this embodiment, the coma generated on the wafer 244 by the first coma imparting optical system 219, 205 and the second coma imparting optical system 210, 220 is maximum in the measuring direction S shown in FIG. 38. Either one of the first coma imparting optical system 219, 205 and the second coma imparting optical system 210, 220 may be employed to generate coma. Since the position detecting illumination light L2 is reflected by the dichroic mirrors 205, 210, the image of the wafer mark 248 which is produced by the imaging device 212X is free from coma.

Figure 38:
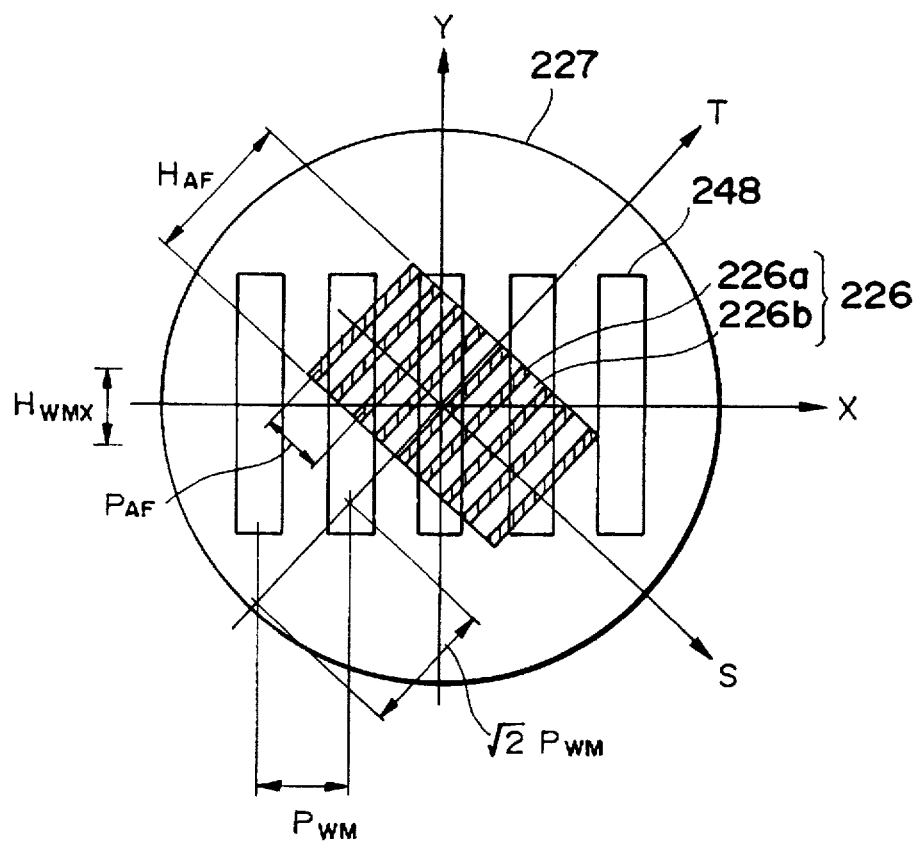
FIG. 38 is an enlarged plan view of a projected image of a focusing mark on the wafer mark in the alignment system shown in FIG. 35.

FIG. 38 shows an observation field surrounding the wafer mark 248 shown in FIG. 35. In FIG. 38, the projected image 226 of the focusing mark, which is the image of the phase pattern 217a shown in FIG. 35, is formed on the wafer mark 248 whose convex and concave patterns are spaced at a pitch $P_{WM}$ in the direction X. The projected image 226 comprises a periodic pattern composed of dark strips 226a and bright strips 226b spaced at a pitch $P_{AF}$ in the measuring direction S. The measuring direction S crosses the direction X which is the measuring direction of the wafer mark 248 at about 45°. A direction perpendicular to the measuring direction is referred to as a non-measuring direction T. An image within a circular observation field 227 surrounding the wafer mark 248 is imaged by the position detecting imaging device 212X shown in FIG. 35. An image of the projected image 226 which is limited to a substantially rectangular region is imaged by the focus detecting imaging device 221 shown in FIG. 35. Pixels of the imaging device 221 are scanned in a direction corresponding to the measuring direction S.

The pitch $P_{WM}$ of the wafer 248 is in the range from 4 to 16 μm, for example, and the pitch $P_{AF}$ of the projected image 226 of the focusing mark is in about the same range as the pitch $P_{WM}$ of the wafer 248. The first objective 208 and the second objective 209 jointly serve as a focusing optical system whose numerical aperture is about 0.2, for example.

Since only the illumination light L2 is applied to the imaging device 212X and only the illumination light L3 is applied to the imaging device 221, the image of the projected image 226 of the focusing mark is not formed on the imaging surface of the position detecting imaging device 212X. However, the image of the wafer mark 248 which is generated in the projected image 226 by the illumination light L3 is formed on the imaging surface of the focus detecting imaging device 221.

In FIG. 35, the imaging device 221 produces an image signal $V_{AF}$ which is supplied to a signal processor 222. The signal processor 222 integrates the image signal $V_{AF}$ in the non-measuring direction perpendicular to the measuring direction into an integral signal $\Sigma V_{AF}$, and calculates an asymmetric extent of the image produced as described above based on the integral signal $\Sigma V_{AF}$. The signal processor 222 then calculates a focusing error of the wafer mark 248 from the calculated asymmetric extent, and outputs the focusing error to a stage control system 223. The stage control system 223 actuates a Z stage 245 in the direction Z by a distance corresponding to the focusing error. In this manner, the wafer mark 248 is brought into focus based on the automatic focusing process.

A process of detecting the position of the wafer mark 248 in the seventh embodiment will be described below with reference to FIGS. 38 through 43. The position of a search alignment mark (not shown in FIG. 35) on the wafer 244 is detected, and the detected position is corrected by an offset value which has been stored as a design value for thereby roughly calculating the position of the wafer mark 248 to be measured. Based on the calculated position, a wafer stage 246 is actuated to position the wafer mark 248 in the observation field of the first objective 208. This process is referred to as search alignment. Thereafter, the wafer 244 is automatically focused using the projected image 226 of the focusing mark which is projected onto the wafer 244.

Before the wafer 244 is automatically focused, in order to lessen the effect of the image of the wafer mark 248 for focus detection, the width $H_{AF}$ of the projected image 226 of the focusing mark in the non-measuring direction T is set to a multiple by a natural number of the pitch $2^{1/2} \cdot P_{WM}$ of the wafer mark 248 in the non-measuring direction T. That is, the width $H_{AF}$ of the projected image 226 is selected to satisfy the following equation (4):

$$H_{AF} = m \cdot 2^{1/2} \cdot P_{WM} \qquad (4)$$

where m is a natural number.

On account of the width $H_{AF}$ being thus selected, the effect of the image of the wafer mark 248 is made substantially constant in the measuring direction S simply by integrating the image signal $V_{AF}$ outputted from the focus detecting imaging device 221 shown in FIG. 35 over the width $H_{AF}$ in the non-measuring direction T. Consequently, the focused position, i.e., the Z coordinate of the surface of the wafer 244, can accurately be detected without being affected by the pattern of the wafer mark 248.

Figure 39:
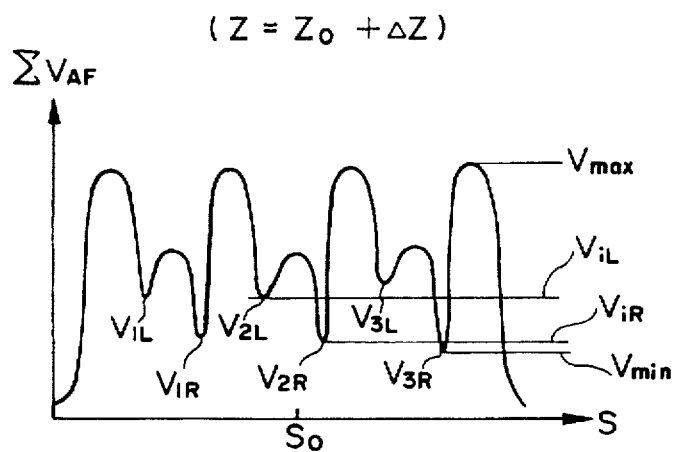
FIGS. 39 through 41 are diagrams showing the manner in which the asymmetric extent of an image formed on an imaging device varies depending on the defocused extent of the wafer.
Figure 40:
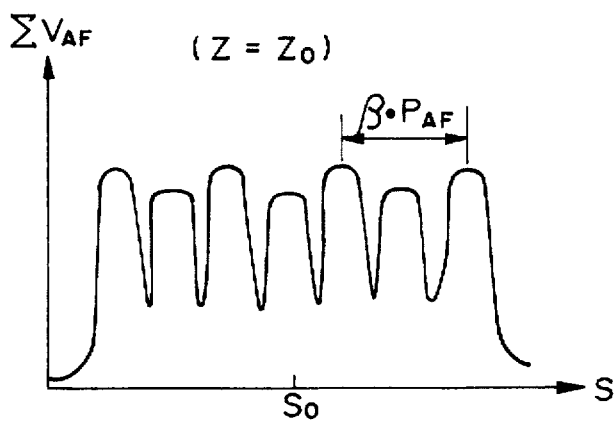
Figure 41:
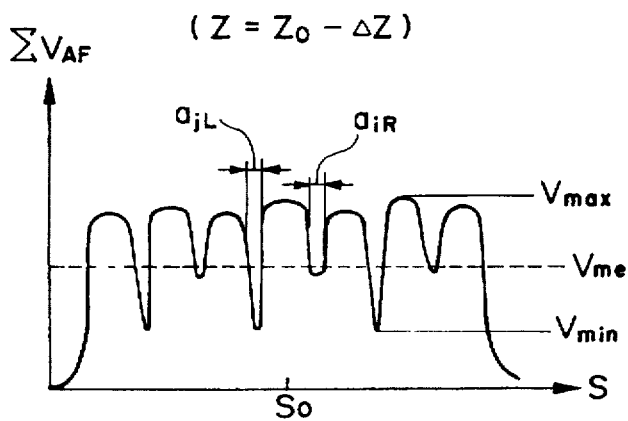

FIGS. 39 through 41 show the integral signal $\Sigma V_{AF}$, which is produced by integrating the image signal $V_{AF}$ outputted from the focus detecting imaging device 221 shown in FIG. 35 in the non-measuring direction T, as plotted against the measuring direction S. In FIG. 39, the Z coordinate of the surface of the wafer 244 is shifted upwardly a distance $\Delta Z$ from a focused position $Z_0$ with respect to the imaging device 212X. In FIG. 40, the Z coordinate of the surface of the wafer 244 is in the focused position $Z_0$. In FIG. 41, the Z coordinate of the surface of the wafer 244 is shifted downwardly the distance $\Delta Z$ from the focused position $Z_0$. The focused position $Z_0$ represents the central position of the projected image. As shown in FIGS. 39 through 41, the asymmetric extent of the integral signal $\Sigma V_{AF}$ in the measuring direction S varies depending on a change in the defocused distance of the surface of the wafer 244. When the wafer 244 is in focus as shown in FIG. 40, the integral signal $\Sigma V_{AF}$ is a symmetrical signal which varies at a pitch $\beta \cdot P_{AF}$ in the measuring direction S where $\beta$ is the magnification of projection from the wafer 244 onto the imaging device 221.

For quantitating the asymmetric extent of the integral signal $\Sigma V_{AF}$, the values of edges or level drops on each side of a period (the pitch $\beta \cdot P_{AF}$) of the integral signal $\Sigma V_{AF}$ are represented by $V_{iL}$, $V_{iR}$ (i=1, 2, 3, ...). Then, the difference $\Delta V_i$ between the values $V_{iL}$, $V_{iR}$ of edges is determined as an index indicative of the asymmetrical extent of the image signal. The difference $\Delta V_i$ is standardized using the difference between maximum and minimum values $V_{max}$, $V_{min}$ of the integral signal $\Sigma V_{AF}$ except for its opposite ends. Therefore, the following equation is satisfied:

$$\Delta V_i = (V_{iR} - V_{iL})/(V_{max} - V_{min}) \qquad (5)$$

The difference $\Delta V_i$ may not necessarily be standardized by $(V_{max} - V_{min})$. Then, the difference $\Delta V_i$ is averaged over n periods (n is an integer of at least 2) of the integral signal $\Sigma V_{AF}$, each of the n periods being equal to the pitch $\beta \cdot P_{AF}$ of the image, which is imaged by the imaging device 221 shown in FIG. 35, of the projected image 226 of the focusing mark, for thereby determining a quantity $\Delta IA$ representing the asymmetrical extent of the image of the projected image 226 of the focusing mark. With the summation symbol $\Sigma$ representing the integration from 1 to n of the suffix i, the quantity $\Delta IA$ satisfies the following equation:

$$\Delta IA = (1/n) \Sigma \Delta V_i \qquad (6)$$

Figure 43:
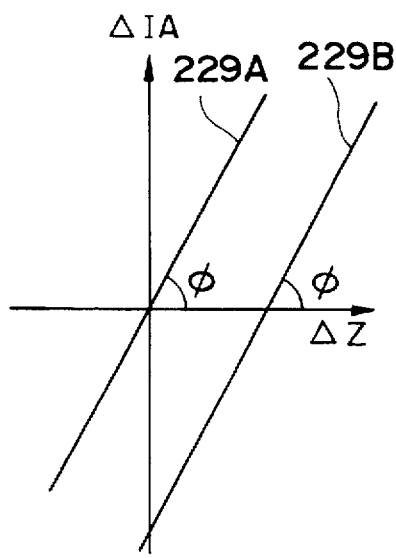
FIG. 43 is a diagram showing the relationship between the defocused extent $\Delta Z$ and the quantity $\Delta IA$ at the time the image is subjected to coma.
Figure 42:
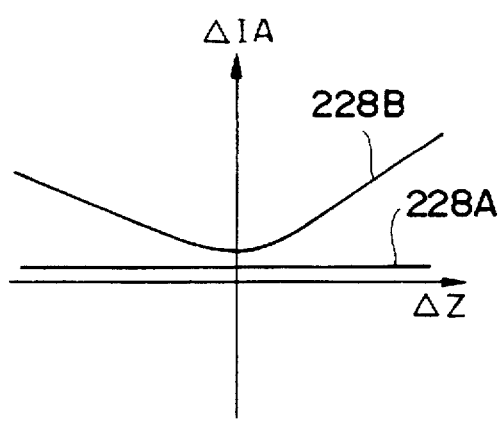
FIG. 42 is a diagram showing the relationship between the defocused extent $\Delta Z$ and a quantity $\Delta IA$ representative of the asymmetric extent of an image at the time the image is ideally focused.

FIGS. 42 and 43 show the quantity $\Delta IA$ representing the asymmetrical extent as it is plotted against the defocused distance $\Delta Z$ of the surface of the wafer 244. FIG. 42 shows characteristics of the quantity $\Delta IA$ when the image is ideally focused, free of coma, and FIG. 43 shows characteristics of the quantity $\Delta IA$ when coma is imparted to the image. In FIG. 42, a straight-line curve 228A indicates characteristics at the time the AF light source 215 shown in FIG. 35 is free of decentration, and a bent-line curve 228A indicates characteristics at the time the AF light source 215 suffers a certain degree of decentration. In FIG. 43, an approximately straight-line curve 229A which passes through the origin indicates characteristics at the time the AF light source 215 is free of decentration, and an approximately straight-line curve 229B which passes off the origin indicates characteristics at the time the AF light source 215 suffers a certain degree of decentration. Regardless of decentration of the AF light source 215, the approximately straight-line curves 229A, 229B have a substantially constant gradient $\tan\Phi$.

As can be seen from FIG. 43, when coma is imparted to the image of the projected image 226 of the focusing mark, the quantity $\Delta IA$ indicative of the asymmetric extent, which is expressed according to the equation (6), varies substantially in proportion to the defocused distance $\Delta Z$ regardless of decentration of the AF light source 215. Therefore, the wafer 244 can be brought into focus by calculating the quantity $\Delta IA$ and controlling the Z stage 245 so that the calculated quantity $\Delta IA$ will reach a certain value, e.g., zero.

The rate of change $\Delta IA/\Delta Z$ of the quantity $\Delta IA$ with respect to the defocused distance $\Delta Z$, i.e., the gradient $\tan\Phi$ shown in FIG. 43, is proportional to the amount of coma which is imparted. The amount of coma can be controlled by varying the thicknesses of the dichroic mirrors 205, 210 and the plane-parallel plates 219, 229 of the first and second coma imparting optical systems. The rate of change $\Delta IA/\Delta Z$ may be regarded as the sensitivity with which to detect the defocused distance, and this sensitivity depends upon a value $\delta$ of the illumination system, which is a ratio of the numerical aperture of the illumination system 215, 216 for the AF phase pattern plate 217 to the numerical aperture of the focusing optical system 206, 208 for projecting the image of the AF phase pattern plate 217 onto the wafer 244, and the steps of the AF phase pattern plate 217.

For increasing the sensitivity with which to detect the defocused distance, it is effective to reduce the value δ of the illumination system, rather than increasing the coma. The rate of change $\Delta IA/\Delta Z$ (detecting sensitivity) is maximized when the steps of the convex and concave strips of the phase pattern 217a of the AF phase pattern plate 217 have a phase difference of 90° (2n+1) (n=0, 1, 2, . . . ) at the central wavelength $\lambda_0$ of the focus detecting illumination light L3. The detecting sensitivity thus achieved is much greater than that of the conventional lateral shifting process, and is essentially free of limitations due to the numerical aperture of the focusing optical system (alignment microscope) composed of the first and second objectives 208, 209. The numerical aperture of the alignment microscope is about 0.2, for example. In this embodiment, the defocused distance can be detected with high sensitivity by appropriately combining the amount of coma imparted and the value δ of the illumination system.

Another advantage of the focus detecting system which utilizes coma according to the seventh embodiment is that when the numerical aperture of the alignment microscope is about 0.2, the rate of change $\Delta IA/\Delta Z$ is linear in a very wide range with respect to the defocused distance $\Delta Z$, covering a sufficiently large focus detecting range which is practically required. The pitch of the projected image 226 of the focusing mark which is projected onto the wafer 244 has almost no bearing on the value of the detecting sensitivity and the linearity of the rate of change $\Delta IA/\Delta Z$.

After the wafer 244 has been focused, the image signal from the imaging device 212X is processed to detect the X coordinate of the wafer mark 248 and thereafter the Y coordinate of the wafer mark 249. Based on the X and Y coordinates thus detected, a corresponding shot area is finally positioned for fine alignment.

[8th Embodiment]

An eighth embodiment of the present invention will be described below with reference to FIGS. 44 through 46. According to the eighth embodiment, one common light source is used as both a position detecting light source and a focus detecting light source. Those parts shown in FIG. 44 which are identical to those shown in FIG. 35 are denoted by identical reference numerals.

Figure 44:
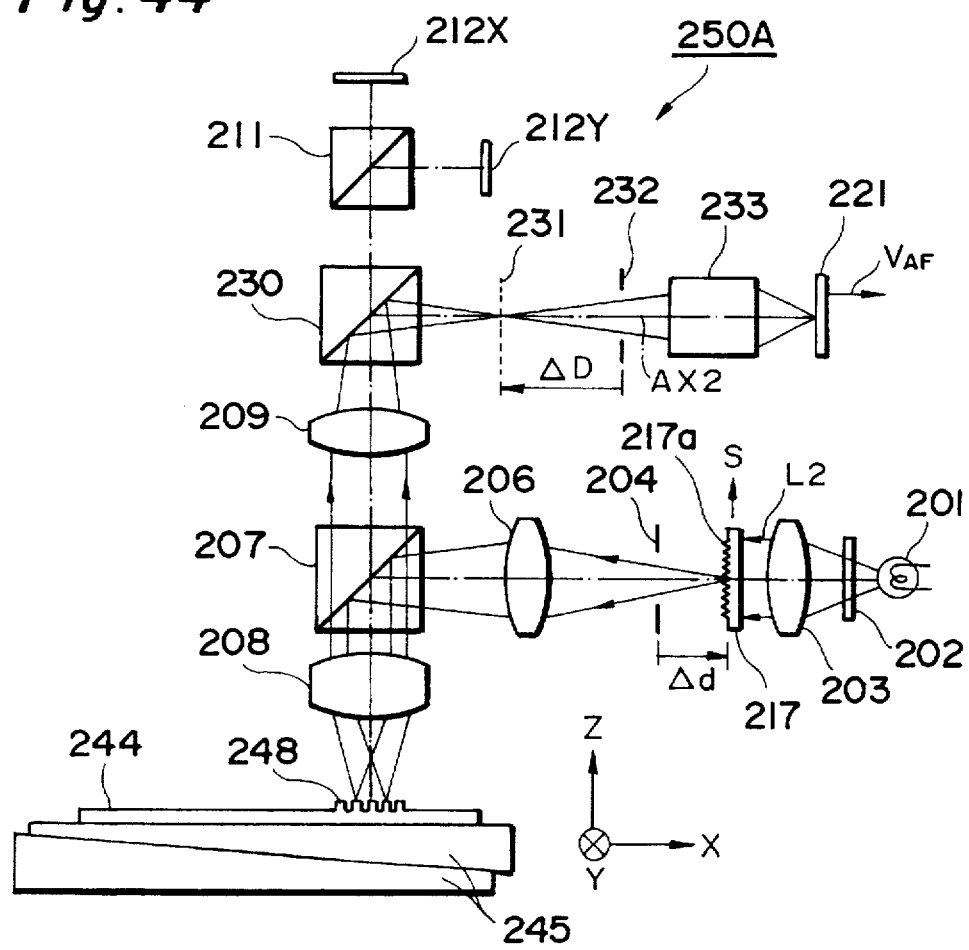
FIG. 44 is a side elevational view of an alignment system according to an eighth embodiment of the present invention which is incorporated in a projection exposure apparatus.

In an alignment system 250A shown in FIG. 44, illumination light emitted from a light source 201 such as a halogen lamp or the like, which is used both a position detecting light source and a focus detecting light source, is applied to an optical bandpass filter 202 which selects illumination light L2. The illumination light L2 is converged onto an AF phase pattern plate 217 by a condenser lens 203. The illumination light L2 that has passed through a phase pattern 271a of the AF phase pattern plate 217 travels through a field stop 204 which is spaced a defocused distance Δd from the AF phase pattern plate 217. The illumination light L2 is then applied through an illumination relay lens 206 to a half-silvered prism 207, which reflects the illumination light L2. The reflected illumination light L2 passes through a first objective 208 and irradiates an observation area containing a wafer mark 248 along the X-axis on a wafer 244.

The field stop 204 and the surface of the wafer 244 are substantially in conjugate relationship to each other with respect to the illumination light L2, and the phase pattern 217a of the AF phase pattern plate 217 is defocused the distance Δd from the plane in conjugate relationship to the wafer 244. This arrangement prevents the phase pattern 217a from presenting an obstacle upon observation of the wafer mark 248.

The illumination light L2 which is reflected by the wafer 244 is converged by the first objective 208 and travels back to the half-silvered prism 207. The light that has passed through the half-silvered prism 207 travels through a second objective 209 to a beam splitter 230. The illumination light L2 that has passed through the beam splitter 230 is divided by a half-silvered prism 211 into two light rays which are applied respectively to imaging surfaces of imaging devices 212X, 212Y along the respective X- and Y-axes. When the wafer 244 is in focus, the imaging surfaces of imaging devices 212X, 212Y are in conjugate relationship to the surface of the wafer 244, forming an image of the wafer mark 248 on the imaging surface of the imaging device 212X along the X-axis.

The light reflected by the beam splitter 230 forms an image of the phase pattern 217a of the AF phase pattern plate 217 on an intermediate image plane 231. The light from the intermediate image plane 231 passes through a field stop 232 for blocking stray light, and then travels through a relay lens system 233 capable of generating coma, forming an image of the phase pattern 217a again on an imaging surface of a focus detecting imaging device 221. When the wafer 244 is in a focused position, the intermediate image plane 231 and the imaging surface of the imaging device 221 are in conjugate relationship to the phase pattern 217a of the AF phase pattern plate 217, and the plane in which the field stop 232 lies is in conjugate relationship to the surface of the wafer 244, with respect to the illumination light L2. Using the defocused distance Δd between the AF phase pattern plate 217 from the field stop 204, the defocused distance ΔD between the plane in which the field stop 232 lies and the intermediate image plane 231 is expressed as follows:

$$\Delta D = (\beta_2/\beta_1)^2 \Delta d \qquad (7)$$

where $\beta_1$ is the magnification of projection by the illumination relay lens 206 and the first objective 208 and $\beta_2$ is the magnification of projection by the first objective 208 and the second objective 209.

In the eighth embodiment, the direction in which the strips of phase pattern 217a of the AF phase pattern plate 217 are arranged is referred to as the measuring direction S, and the relay lens system 233 generates and imparts coma to an image of the phase pattern 217a which is projected onto the imaging surface of the imaging device 221 such that the coma is maximum in a direction (referred to as a "measuring direction S on the imaging surface") corresponding to the measuring direction S. An image signal is read from the imaging device 221 along the measuring direction S on the image of the phase pattern 217a.

A region in which the phase pattern 217a is projected, i.e., a focus detecting region, is not limited to the region inside the wafer mark 248, but the image of the phase pattern 217a may be projected onto a certain region including the wafer mark 248. Such a wider focus detecting region is effective to reduce a detecting error through an averaging effect. Accordingly, there are no limitations on the pitch of the projected image of the focusing mark, such as the image of the phase pattern 217a, and the region in which the phase pattern 217a is projected.

A focus detecting process according to the eighth embodiment will be described below. As shown in FIG. 44, since the pattern surface of the AF phase pattern plate 217 is defocused the distance Δd from the plane in conjugate relationship to the wafer 244, when the wafer 244 is in focus, the image of the phase pattern 217a of the AF phase pattern plate 217 which is projected onto the wafer 244 is blurred, and the illuminance distribution in the fields of the objectives 208, 208 is substantially uniform. However, the image of the wafer mark 248 is sharply focused on the position detecting imaging device 212X, and the blurred image of the phase pattern 217a serves as substantially uniform background light.

When the wafer 244 is in focus, the image of the phase pattern 217a is sharply focused on the focus detecting imaging device 221, but the image of the wafer mark 248 is blurred thereon, producing substantially uniform background light. Furthermore, the image of the phase pattern 217a on the focus detecting imaging device 221 suffers coma in a direction corresponding to the measuring direction S, i.e., the direction in which the dark and bright strips are arranged, or the scanning direction. Since the relay lens system 233 for generating coma is disposed outside of the optical path of the position detecting light, the image of the wafer mark 248 on the position detecting imaging device 212X is subjected to no coma. Accordingly, the process of detecting the position of the wafer 244 and the process of detecting the focused position of the wafer 244 can be carried out highly accurately independently of each other.

In the eighth embodiment, an image signal $V_{AF}$ outputted from the imaging device 221 is also integrated in the non-measuring direction to produce an integral signal $\Delta V_{AF}$. The integral signal $\Delta V_{AF}$ varies depending on the defocused distance $\Delta Z$ of the wafer 244 in the same manner as shown in FIGS. 39 through 41 as with the seventh embodiment. Consequently, as with the seventh embodiment, the defocused distance $\Delta Z$ of the wafer 244 can be detected on the basis of the asymmetric extent of the integral signal $\Delta V_{AF}$ in the measuring direction S.

Another process of quantitating the asymmetric extent of the integral signal $\Sigma V_{AF}$ is as follows: As shown in FIG. 41, the widths $a_{iL}$, $a_{iR}$ (i=1, 2, 3, ...) of edges or level drops of a period (corresponding to two peaks) of the integral signal $\Sigma V_{AF}$ in the measuring direction S are measured. To this end, an average $V_{me}$ (=$(V_{max}+V_{min})/2$) of maximum and minimum values $V_{max}$, $V_{min}$ of the integral signal $\Sigma V_{AF}$ except for its opposite ends is determined, and a width produced when the value of the integral signal $\Sigma V_{AF}$ traverses the average $V_{me}$ is measured. Then, the difference $\Delta a_i$ between the widths $a_{iL}$, $a_{iR}$ of edges is calculated as an index indicative of the asymmetric extent of the integral signal $\Sigma V_{AF}$ in the measuring direction S, as follows:

$$\Delta a_i = a_{iR} - a_{iL} \quad (8)$$

Then, the difference $\Delta a_i$ is averaged over n periods (n is an integer of at least 2) of the integral signal $\Sigma V_{AF}$, each of the n periods being equal to the pitch (corresponding to two peaks) of the image, which is imaged by the imaging device 221, of the phase pattern 217a, for thereby determining a quantity $\Delta IB$ representing the asymmetrical extent of the image of the phase pattern 217a. With the summation symbol $\Sigma$ representing the integration from 1 to n of the suffix i, the quantity $\Delta IB$ satisfies the following equation:

$$\Delta IB = (1/n)\Sigma \Delta a_i \quad (9)$$

As with the quantity $\Delta IA$ expressed by the equation (6) in the seventh embodiment, the quantity $\Delta IB$ represented by the above equation (9) varies substantially in proportion to the defocused distance $\Delta Z$ of the wafer 244. Thus, the automatic focusing process can be effected in the same manner as with the seventh embodiment. The rate of change (detecting sensitivity) of the quantity $\Delta IB$ with respect to the defocused distance $\Delta Z$ and the linearity of the rate of change are the same as those of the seventh embodiment.

With the arrangement of the eighth embodiment, therefore, the focused position of the wafer can be detected with high sensitivity by imparting coma to detect the asymmetric extent of the image signal. Furthermore, because the focus detecting illumination light has the same wide wavelength band as the position detecting (alignment) illumination light, the automatic focusing image signal is less susceptible to a thin-film interference caused by the photoresist coated on the wafer 244. Since a common light source is shared by the process of detecting the focused position of the wafer and the process of detecting the position of the wafer, the entire optical system is simplified.

Specific structures for the relay lens system 233 capable of imparting coma will be described below with reference to FIGS. 45 and 46.

Figure 45:
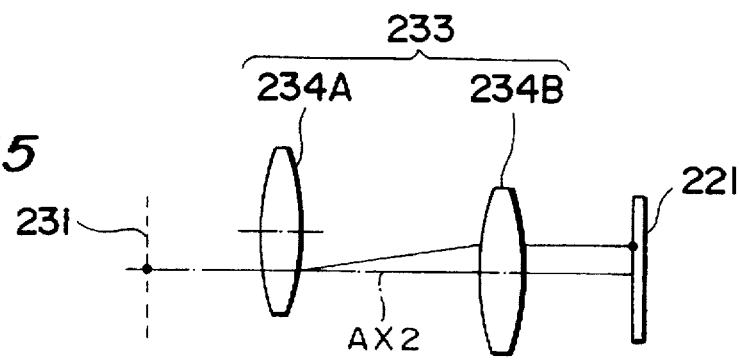
FIGS. 45 and 46 are diagrams showing relay lens systems, respectively, for imparting coma in the alignment system shown in FIG. 44.

FIG. 45 shows a relay lens system 233 comprising a first relay lens 234A and a second relay lens 234B for relaying an image on the intermediate image plane 231 to the imaging device 221. The front first relay lens 234A, for example, is displaced off an optical axis AX2 to impart decentered coma to the focus detecting image on the imaging device 221. Alternatively, the first relay lens 234A may have its own optical axis aligned with the optical axis AX2, and the relay lens system 233 may be decentered as a whole to cause the light from the intermediate image plane 231 to travel off the axis of the relay lens system 233, so that the image on the imaging device 221 is subjected to coma due to the height of the image. In any case, the amount of generated coma can be controlled by the extent to which the lens or lenses are decentered.

Figure 46:
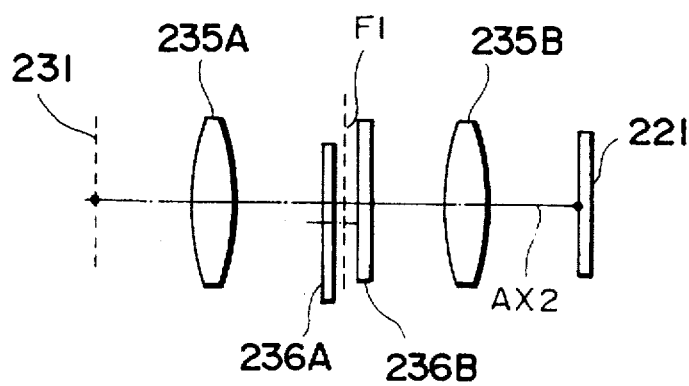

FIG. 46 shows another relay lens system 233 comprising two relay lenses 235A, 235B for relaying an image on the intermediate image plane 231 to the imaging device 221, and a pair of closely positioned zone plates 236A, 236B disposed between the relay lenses 235A, 235B near a pupil plane (Fourier transform plane) F1. The zone plate 235A, for example, may be displaced off an optical axis AX2, so that the zone plates 235A, 235B may be displaced relatively to each other for controlling the amount of coma generated on the imaging device 221.

In the eighth embodiment shown in FIG. 44, the AF phase pattern plate 217 is defocused from the plane in conjugate relationship to the wafer 244 for independently effecting the process of detecting the focused position of the wafer and the process of detecting the position of the wafer. However, the AF phase pattern plate 217 may be positioned in the plane in conjugate relationship to the wafer 244 (the distance $\Delta d=0$ in FIG. 44). In such a modification, an image representing the projected image 226 (see FIG. 38) which is large enough to cover the wafer mark 248 in its entirety is observed on the imaging device 212X along the X-axis shown in FIG. 44. For accurately carrying out the process of detecting the focused position of the wafer and the process of detecting the position of the wafer, the measuring direction S of the projected image 226 of the focusing mark, i.e., the image of the phase pattern 217a, crosses the direction X which is the measuring direction of the wafer mark 248 at 45° as with the arrangement shown in FIG. 38, for thereby enabling the relay lens system 233 shown in FIG. 44 to generate maximum coma in a direction corresponding to the measuring direction S.

The width $H_{AF}$ in the non-measuring direction T for integrating the image signal from the imaging device 221 is subject to the equation (4) according to the seventh embodiment for detecting the focused position of the wafer 244 without being affected by the wafer mark 248.

In the eighth embodiment, the image of the projected image 226 of the focusing mark is formed on the position detecting imaging device 212X. To remove the effect imposed by this image, the image signal outputted from the imaging device 212X is integrated in the direction Y in a region having a width $H_{WMX}$ and extending in the direction Y which is perpendicular to the measuring direction (the direction X) of the wafer 248 in FIG. 38. The width $H_{WMX}$ is selected to contain an integral number of bright and dark strips of the projected image 226 of the focusing mark. Since the pitch in the direction Y of the projected image 226 is $2^{1/2} \cdot P_{AF}$, the width $H_{WMX}$ may be defined as follows:

$$H_{WMX} = m' \cdot 2^{1/2} \cdot P_{AF} \quad (10)$$

where m' is a natural number.

Even if the common light source is employed and the AF phase pattern plate 217 is not defocused, the position in the direction X of the wafer mark 248 can accurately be detected without being affected by the image of the phase pattern 217a of the AF phase pattern plate 217. Furthermore, even when the wafer mark 248 an the image of the phase pattern 217a (the projected image 226) are positionally displaced with respect to each other as a result of search alignment, the image signal is integrated to make the effect of the image of the phase pattern 217a constant (with a DC component). As a consequence, the accuracy of positional detection is maintained at a high level.

[9th Embodiment]

A ninth embodiment of the present invention will be described below with reference to FIG. 47. According to the ninth embodiment, the wafer mark itself is regarded as a focusing mark. Those parts shown in FIG. 47 which are identical to those shown in FIG. 35 are denoted by identical reference numerals.

Figure 47:
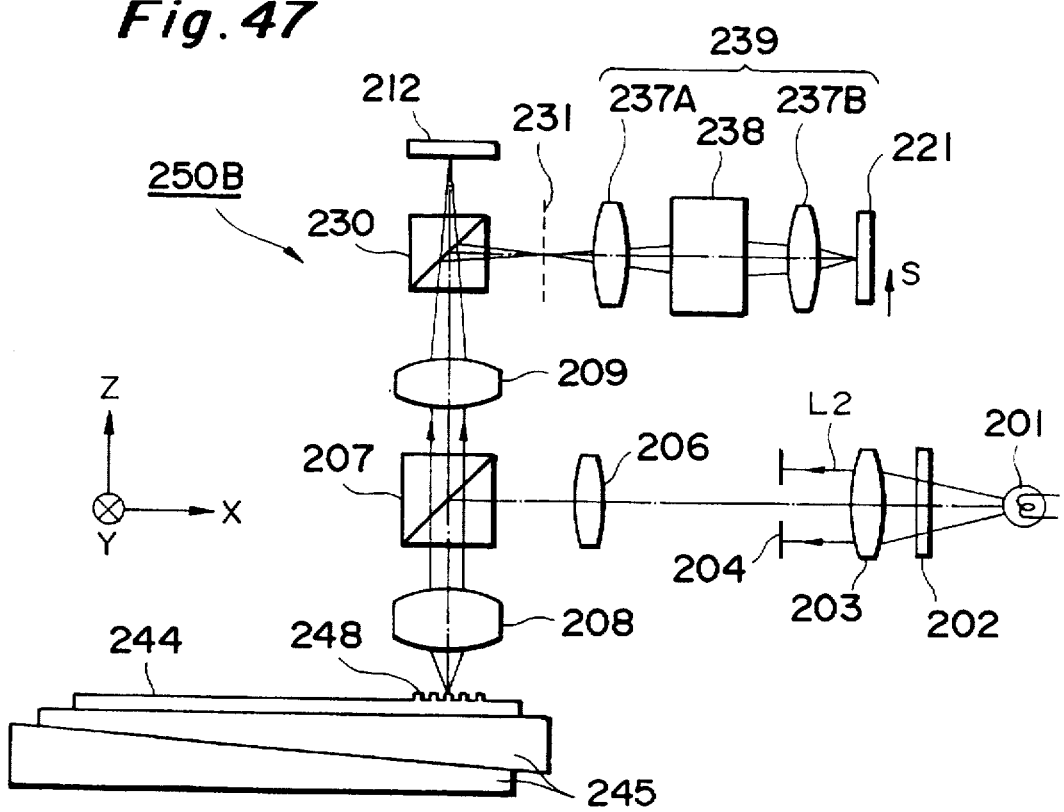
FIG. 47 is a side elevational view of an alignment system according to a ninth embodiment of the present invention which is incorporated in a projection exposure apparatus.

In an alignment system 250B shown in FIG. 47, illumination light emitted from a light source 201 such as a halogen lamp or the like, which is used both a position detecting light source and a focus detecting light source, is applied to an optical bandpass filter 202 which selects illumination light L2. The illumination light L2 is converged onto a field stop 204 by a condenser lens 203. The illumination light L2 that has passed through the field stop 204 travels through an illumination relay lens 206 to a half-silvered prism 207, which reflects the illumination light L2. The reflected illumination light L2 passes through a first objective 208 and irradiates an observation area containing a wafer mark 248 along the X-axis on a wafer 244.

With respect to the illumination light L2, the field stop 204 and the surface of the wafer 244 are substantially in conjugate relationship to each other. The field stop 204 defines a position on the wafer 244 and an observation field for focus detection. The illumination light L2 which is reflected by the wafer 244 is converged by the first objective 208 and travels back to the half-silvered prism 207. The light that has passed through the half-silvered prism 207 travels through a second objective 209 to a beam splitter 230. When the wafer 244 is in focus, the light that has passed through the beam splitter 230 forms an image of the wafer mark 248 on an imaging surface of a position detecting imaging device 212. Therefore, when the wafer 244 is in focus, the imaging surface of the imaging device 212 is in conjugate relationship to the surface of the wafer 244.

The light reflected by the beam splitter 230 forms an image of the wafer mark 248 on an intermediate image plane 231. The light from the intermediate image plane 231 passes through a relay lens system 239 capable of generating coma, forming an image of the wafer mark 248 again on an imaging surface of a focus detecting imaging device 221. When the wafer 244 is in a focused position, the imaging surface of the imaging device 212, the intermediate image plane 231, and the imaging surface of the imaging device 221 are in conjugate relationship to the surface of the wafer 244, with respect to the illumination light L2.

The relay lens system 239 comprises a first relay lens 237A, a coma generating optical system 238, and a second relay layer 237B. The coma generating optical system 238 may comprise, for example, a pair of zone plates 236A, 236B as shown in FIG. 46. An optical component of the coma generating optical system 238 is decentered off axis to impart coma to an image on the imaging device 221. The direction, i.e., the measuring direction S, in which the coma is maximized corresponds to the direction X of the pitch of the wafer mark 248.

In the ninth embodiment, the asymmetric extent in the measuring direction S of the image of the wafer mark 248 on the imaging device 221 is determined to detect a defocused distance of the wafer 244. Thereafter, the wafer 244 is corrected out of the defocused distance by a Z stage 245, and then the position of the wafer mark 248 is detected on the basis of the image of the wafer mark 248 on the position detecting imaging device 212. At this time, inasmuch as the wafer mark 248 itself is used as a focusing mark, the entire optical system is simple in structure, and the S/N ratios of a focus detecting signal and a position detecting signal are high enough to allow the wafer 244 to be automatically focused and positionally detected (aligned) with high accuracy.

While the position of the mark to be detected is detected by the FIA method in this embodiment, the principles of the present invention are also applicable for stable automatic focusing to an alignment system of the so-called heterodyne interference type in which coherent laser beams are applied to the mark to be detected from two directions, and the position of the mark is detected on the basis of the phase of a heterodyne beam that returns from the mark.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.307614/1994 filed on Dec. 12, 1994, No.20325/1995 filed on Feb. 8, 1995 and No.89404/1995 filed on Apr. 14, 1995 are hereby incorporated by reference.

What is claimed is:

1. A method of aligning a mask pattern and a photosensitive substrate with each other in a projection exposure apparatus comprising:

a projection optical system for projecting an image of said mask pattern onto said photosensitive substrate;

an off-axis alignment system for detecting a position of a positioning mark on said photosensitive substrate irrespective of said projection optical system, alignment between said mask pattern and said photosensitive substrate being performed based on result of the detection by said alignment system;

a first oblique-incidence focus detecting system for applying a first ray of light to said photosensitive substrate obliquely to an optical axis of said projection optical system to measure a deviation along said optical axis between an image plane of said projection optical system and a surface of said photosensitive substrate; and a second focus detecting system for applying a second ray of light to a region, on said photosensitive substrate, in association with an observation region of said alignment system on said photosensitive substrate and detecting and photoelectrically converting said second ray of light reflected by said photosensitive substrate into a detected signal to measure a deviation between a focused plane of said alignment system and the surface of said photosensitive substrate based on said detected signal, said method comprising the steps of:

(a) aligning a predetermined measurement spot on said photosensitive substrate with the focused plane of said alignment system based on a deviation, measured by said first focus detecting system, of said predetermined measurement spot from the image plane of said projection optical system;

(b) storing, as a reference detected signal, a detected signal produced by said second focus detecting system when said second ray of light is applied on or near said predetermined measurement spot while said predetermined measurement spot is being aligned with a center of the observation region of said alignment system; and (c) detecting the position of said positioning mark by said alignment system while the detected signal produced by said second focus detecting system is being set to the same as said reference detected signal.

2. A method according to claim 1, wherein in said step (c), a plurality of measuring patterns are projected onto said photosensitive substrate from said second focus detecting system, and a pattern selected, depending on the position of said positioning mark which is an object of measuring, from said plurality of measuring patterns, by said second focus detecting system.

3. A method according to claim 1, wherein said second focus detecting system has an optical system which is not telecentric, and detects a focused position by detecting a centroid of a light intensity distribution on a surface of said photosensitive substrate.

4. A position detecting apparatus comprising:

a position detecting illumination system for applying a first ray of light to a positioning mark disposed on a substrate at a fixed pitch in a predetermined direction;

a photoelectric detector for detecting said first ray of light returning from said positioning mark;

a focus detecting illumination system for applying a second ray of light to said positioning mark;

a focus detecting reception system for converging said second ray of light returning from said positioning mark to form an image of said positioning mark;

an imaging device for imaging the image of said positioning mark which is formed by said focus detecting reception system;

an image signal processor for processing an image signal from said imaging device in a predetermined measuring direction to detect a focused condition of said positioning mark;

a height adjusting device for adjusting a height of said substrate, a position of said positioning mark being detected based on a detected signal from said photoelectric detector after the height of the substrate is adjusted by said height adjusting device to optimize the focused condition of said positioning mark which is detected by said image signal processor; and a field limiting device for limiting an observation field of said imaging device, a width of said observation field in a direction perpendicular to said measuring direction in said image signal processor being limited by an integral multiple of a pitch of the image of said positioning mark in the direction perpendicular to said measuring direction.

5. A position detecting apparatus according to claim 4, wherein said field limiting device is a field stop disposed in said focus detecting illumination system and positioned in a plane which is substantially conjugate with a surface of said substrate.

6. A position detecting apparatus according to claim 4, wherein said field limiting device is a field stop disposed in said focus detecting reception system and positioned in a plane which is substantially conjugate with a surface of said substrate.

7. A position detecting apparatus according to claim 4, wherein said field limiting device extracts only a signal representing said observation field from the image signal from said imaging device.

8. A position detecting apparatus according to claim 5, wherein said position detecting illumination system and said focus detecting illumination system are integrated into an integral illumination system, and a striped pattern formed at a fixed pitch in said measuring direction in said image signal processor is disposed in a plane, within said integral illumination system, substantially conjugate with said substrate.

9. A position detecting apparatus according to claim 6, wherein said position detecting illumination system and said focus detecting illumination system are integrated into an integral illumination system, and a striped pattern formed at a fixed pitch in said measuring direction in said image signal processor is disposed in a plane, within said integral illumination system, substantially conjugate with said substrate.

10. A position detecting apparatus according to claim 7, wherein said position detecting illumination system and said focus detecting illumination system are integrated into an integral illumination system, and a striped pattern formed at a fixed pitch in said measuring direction in said image signal processor is disposed in a plane, within said integral illumination system, substantially conjugate with said substrate.

11. A projection exposure apparatus for projecting and transferring a pattern on a mask onto a photosensitive substrate, comprising:

a mask stage for supporting said mask;

a substrate stage for supporting said photosensitive substrate;

a projection optical system for making a position on said mask supported by said mask stage and a position on said photosensitive substrate supported by said substrate stage conjugate with each other;

a position detecting illumination system for applying a first ray of light to a positioning mark formed on said photosensitive substrate at a fixed pitch in a predetermined direction;

a photoelectric detector for detecting said first ray of light returning from said positioning mark;

a focus detecting illumination system for applying a second ray of light on said positioning mark;

a focus detecting reception system for converging said second ray of light returning from said positioning mark to form an image of said positioning mark;

an imaging device for imaging the image of said positioning mark which is formed by said focus detecting reception system;

an image signal processor for processing an image signal from said imaging device in a predetermined measuring direction to detect a focused condition of said positioning mark;

a height adjusting device for adjusting a height of said photosensitive substrate, a position of said positioning mark being detected based on a detected signal from said photoelectric detector after the height of said photosensitive substrate is adjusted by said height adjusting device to optimize the focused condition of said positioning mark which is detected by said image signal processor; and a field limiting device for limiting an observation field of said imaging device, a width of said observation field in a direction perpendicular to said measuring direction in said image signal processor being limited by an integral multiple of a pitch of the image of said positioning mark in the direction perpendicular to said measuring direction.

12. An apparatus for detecting a position of a surface to be detected in a direction normal to said surface to be detected, comprising:

a detection optical system for forming an image of a pattern formed on said surface to be detected based on a ray of light from said pattern;

a coma imparting optical system for generating coma with respect to the image formed by said detection optical system; and a detector for detecting the position of said surface to be detected in a direction normal to said surface to be detected, based on an asymmetrical extent of the image of said pattern.

13. An apparatus for detecting a position of a surface to be detected in a direction normal to said surface to be detected, comprising:

a projection optical system for projecting a predetermined pattern onto said surface to be detected;

a detection optical system for forming an image of said predetermined pattern projected on said surface to be detected based on a ray of light from said pattern;

a coma imparting optical system for generating coma with respect to the image formed by said detection optical system; and a detector for detecting the position of said surface to be detected in a direction normal to said surface to be detected, based on an asymmetrical extent of the image of said pattern.

14. An apparatus according to claim 12, wherein said coma imparting optical system generates coma along a direction in which an asymmetrical extent of the image of said pattern is measured.

15. An apparatus according to claim 13, wherein said coma imparting optical system generates coma along a direction in which an asymmetrical extent of the image of said pattern is measured.

16. An apparatus according to claim 12, further comprising an observation optical system for forming an image in an observation field which contains said pattern on said surface to be detected, said coma imparting optical system being positioned outside of a path of light of said observation optical system.

17. An apparatus according to claim 13, further comprising an observation optical system for forming an image in an observation field which contains said pattern on said surface to be detected, said coma imparting optical system being positioned outside of a path of light of said observation optical system.

18. An apparatus for detecting a position of a surface to be detected in a direction normal to said surface to be detected, comprising:

an illumination system for illuminating a pattern plate having a pattern to be detected which is arranged in a predetermined measuring direction;

a projection optical system for projecting a defocused image of said pattern to be detected onto said surface to be detected;

a light dividing system for dividing a ray of light from said surface to be detected into two rays of light;

a detection optical system for forming an image of said pattern to be detected based on one of said two rays of light from said light dividing system;

an observation optical system for forming an image, used for observation, on said surface to be detected based on the other of said two rays of light from said light dividing system;

a coma imparting optical system disposed in said detection optical system for generating coma with respect to the image of said pattern to be detected; and a detector for detecting the position of said surface to be detected in a direction normal to said surface to be detected, based on an asymmetrical extent of the image of said pattern to be detected in said measuring direction.

19. A projection exposure apparatus comprising:

a projection optical system for projecting an image of a mask pattern onto a photosensitive substrate;

a substrate stage for moving said photosensitive substrate in a direction perpendicular to an optical axis of said projection optical system;

an observation optical system for forming an image of a positioning mark on said photosensitive substrate;

a position detecting device for detecting a position, near said positioning mark, of said photosensitive substrate in a direction of an optical axis of said projection optical system, said position detecting device comprising a detection optical system for forming an image of at least one of said positioning mark and the pattern projected onto said photosensitive substrate, and a coma imparting optical system for generating coma with respect to the image formed by said detection optical system;

a position adjusting device for adjusting a relative position between said photosensitive substrate and said observation optical system in the direction of the optical axis of said projection optical system, the alignment of said photosensitive substrate being performed based on a position of the image of said positioning mark formed by said observation optical system after said photosensitive substrate is brought into focus with said observation optical system by said position adjusting device based on result of the detection by said position detecting device; and a detector for detecting a position of a surface of said photosensitive substrate in the direction of the optical axis of said projection optical system, based on an asymmetrical extent of the image of said pattern.

* * * * *